(12) United States Patent
Burke et al.

(10) Patent No.: US 8,092,625 B2
(45) Date of Patent: Jan. 10, 2012

(54) INTEGRATED CIRCUIT PLACEMENT SYSTEM

(75) Inventors: David Oliver Burke, Balmain (AU); Jan Waszczuk, Balmain (AU); Desmond Bruce Boyton, Balmain (AU); Craig Donald Strudwicke, Balmain (AU); William Granger, Balmain (AU); Jason Mark Thelander, Balmain (AU); Eric Patrick O'Donnell, Balmain (AU); Peter John Morley Sobey, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 248 days.

(21) Appl. No.: 12/193,745

(22) Filed: Aug. 19, 2008

(65) Prior Publication Data

US 2010/0047043 A1 Feb. 25, 2010

(51) Int. Cl.
*B32B 41/00* (2006.01)

(52) U.S. Cl. ....... 156/64; 156/358; 156/360; 156/583.1; 29/739; 29/740

(58) Field of Classification Search .................. 156/358, 156/360, 580, 583.1, 64; 29/739, 740
See application file for complete search history.

(56) References Cited

U.S. PATENT DOCUMENTS

| | | | |
|---|---|---|---|
| 4,375,126 A | 3/1983 | Dull et al. | |
| 4,451,324 A | 5/1984 | Ichikawa et al. | |
| 4,627,787 A | 12/1986 | Bond et al. | |
| 4,914,809 A | 4/1990 | Fukai et al. | |
| 4,921,564 A | 5/1990 | Moore | |
| 5,251,266 A | 10/1993 | Spigarelli et al. | |
| 5,458,387 A | 10/1995 | Conway et al. | |
| 5,598,965 A | 2/1997 | Scheu | |
| 5,876,556 A | 3/1999 | Takanami | |
| 5,924,833 A | 7/1999 | Conboy et al. | |
| 6,132,161 A | 10/2000 | Shih et al. | |
| 6,463,359 B2 | 10/2002 | Fischer | |
| 6,468,021 B1 | 10/2002 | Banora et al. | |
| 6,543,513 B1 | 4/2003 | Lau et al. | |
| 6,627,037 B1 | 9/2003 | Kurokawa et al. | |
| 6,640,423 B1 | 11/2003 | Johnson et al. | |
| 6,701,610 B1 | 3/2004 | Van de Vall et al. | |
| 6,718,626 B2 * | 4/2004 | Kawada | 29/740 |
| 6,865,803 B2 | 3/2005 | Hidese | |
| 6,961,456 B2 | 11/2005 | Bonner et al. | |
| 2002/0083584 A1 * | 7/2002 | Isogai et al. | 29/743 |
| 2002/0092157 A1 | 7/2002 | Yoshida et al. | |
| 2003/0106207 A1 * | 6/2003 | Terui | 29/740 |
| 2004/0025327 A1 * | 2/2004 | Silverbrook et al. | 29/611 |

(Continued)

FOREIGN PATENT DOCUMENTS

JP 62232131 A * 10/1987

*Primary Examiner* — George Koch

(57) ABSTRACT

This invention relates to a dice placement assembly for placing dice on a carrier. The assembly includes a support platform with a clamp mechanism configured to clamp the carrier onto said platform, and at least one camera operatively directed at the platform to detect alignment fiducials on the carrier. The assembly also includes a placement device having a vacuum mechanism to retrieve the dice from a supply mechanism, said placement device having actuators to align the dice with the carrier and to place the dice thereon once aligned, and a heater to heat the dice prior to placement on the test bed. Further included is a controller operatively controlling the clamp mechanism, the camera and the placement device, to facilitate accurate placement of the dice on the carrier.

8 Claims, 35 Drawing Sheets

U.S. PATENT DOCUMENTS

| | | | |
|---|---|---|---|
| 2004/0163242 A1* | 8/2004 | Fukunaga | 29/833 |
| 2004/0191034 A1 | 9/2004 | Rezaei | |
| 2005/0188525 A1 | 9/2005 | Weber et al. | |
| 2006/0033784 A1 | 2/2006 | Keenan et al. | |
| 2006/0185157 A1 | 8/2006 | Shida et al. | |
| 2007/0124927 A1 | 6/2007 | Konrath et al. | |

* cited by examiner

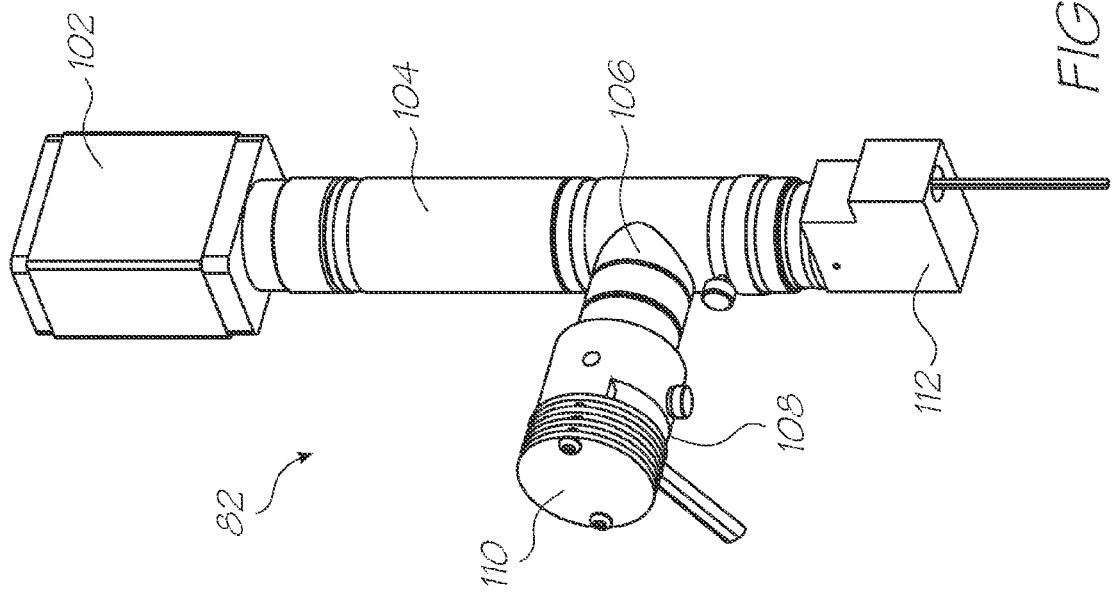
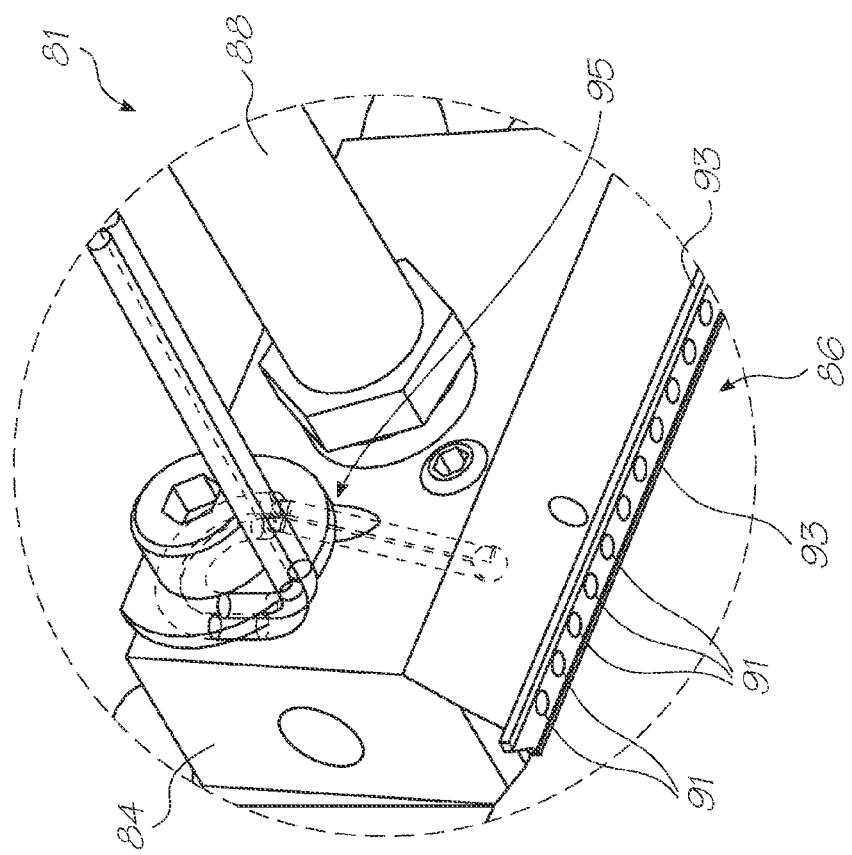

INTEGRATED CIRCUIT PLACEMENT SYSTEM

FIELD OF INVENTION

The invention relates to the assembly of printhead integrated circuit components. More specifically, the invention provides for an assembler and associated methods of assembling printhead integrated circuits on a carrier.

CO-PENDING APPLICATIONS

The following applications have been filed by the Applicant simultaneously with the present application:

| | | | | | |
|---|---|---|---|---|---|
| 12,193,715 | 12,193,716 | 12,193,717 | 12,193,718 | 12,193,719 | 12,193,720 |
| 7,804,292 | 7,786,723 | 12,193,723 | 12,193,724 | 12,193,725 | 7,789,477 |
| 12,193,727 | 12,193,728 | 12,193,729 | 12,193,730 | 12,193,731 | 12,193,732 |
| 12,193,733 | 12,193,734 | 12,193,735 | 12,193,736 | 7,721,420 | 12,193,738 |
| 12,193,739 | 12,193,740 | 12,193,741 | 7,805,832 | 12,193,743 | 12,193,747 |
| 12,193,748 | 12,193,750 | 12,193,751 | 12,193,753 | | |

The disclosures of these co-pending applications are incorporated herein by reference.

CROSS REFERENCES

The following patents or patent applications filed by the applicant or assignee of the present invention are hereby incorporated by cross-reference.

| | | | | | |
|---|---|---|---|---|---|
| 11/246,687 | 11/246,718 | 7,322,681 | 11/246,686 | 11/246,703 | 11/246,691 |
| 11/246,711 | 11/246,690 | 11/246,712 | 11/246,717 | 7,401,890 | 7,401,910 |
| 11/246,701 | 11/246,702 | 11/246,668 | 11/246,697 | 11/246,698 | 11/246,699 |
| 11/246,675 | 11/246,674 | 11/246,667 | 11/829,957 | 11/829,960 | 11/829,961 |
| 11/829,962 | 11/829,963 | 11/829,966 | 11/829,967 | 11/829,968 | 11/829,969 |
| 11,946,839 | 11,946,838 | 11,946,837 | 11,951,230 | 12,141,034 | 12,140,265 |
| 12,183,003 | 11/688,863 | 11/688,864 | 11/688,865 | 7,364,265 | 11/688,867 |
| 11/688,868 | 11/688,869 | 11/688,871 | 11/688,872 | 11/688,873 | 11/741,766 |
| 12,014,767 | 12,014,768 | 12,014,769 | 12,014,770 | 12,014,771 | 12,014,772 |
| 12,014,773 | 12,014,774 | 12,014,775 | 12,014,776 | 12,014,777 | 12,014,778 |
| 12,014,779 | 12,014,780 | 12,014,781 | 12,014,782 | 12,014,783 | 12,014,784 |
| 12,014,785 | 12,014,787 | 12,014,788 | 12,014,789 | 12,014,790 | 12,014,791 |
| 12,014,792 | 12,014,793 | 12,014,794 | 12,014,796 | 12,014,798 | 12,014,801 |
| 12,014,803 | 12,014,804 | 12,014,805 | 12,014,806 | 12,014,807 | 12,049,371 |
| 12,049,372 | 12,049,373 | 12,049,374 | 12,049,375 | 12,103,674 | 12,146,399 |

BACKGROUND

Pagewidth printers that incorporate micro-electromechanical components generally have printhead integrated circuits that include a silicon substrate with a large number of densely arranged micro-electromechanical nozzle arrangements. Each nozzle arrangement is responsible for ejecting a stream of ink drops.

In order for such printers to print accurately and maintain quality, it is important that the printhead integrated circuits be tested. This is particularly important during the design and development of such integrated circuits.

Some form of carrier is generally required for testing such integrated circuits.

SUMMARY

According to a first aspect of the invention, there is provided an assembler for assembling printhead dice on a carrier, the assembler comprising a support assembly;

a wafer positioning assembly arranged on the support assembly and configured to retain and position a wafer containing printhead dice to be picked from the wafer;

a dice picking assembly arranged on the support assembly and configured to pick a pre-selected dice from the wafer;

a dice placement assembly arranged on the support assembly and configured to receive the pre-selected dice and to place the dice on the carrier;

a dice conveyance mechanism arranged on the support assembly and configured to convey the dice from the dice picking assembly to the dice placement assembly; and a control system operatively engaged with the wafer positioning, dice picking, dice placement and dice conveyance assemblies to control operation thereof.

The support assembly may include an optical table and a block mounting member positioned on the optical table, the wafer positioning assembly being positioned on the block mounting member and the support assembly being configured to support the dice picking assembly above the wafer positioning assembly.

The wafer positioning assembly may include a base member mounted on the block and first and second stages mounted on the base member, the first stage interposed between the base member and the second stage and being displaceable relative to the base member along a first linear axis, the second stage being displaceable relative to the first stage along a second linear axis orthogonal to the first linear axis, and a wafer support assembly positioned on the second stage for rotation about a rotational axis orthogonal to both the first and second linear axes, the wafer support assembly being configured to support the wafer.

The dice picking assembly may include a carrier assembly fast with the support assembly and displaceable relative to the support assembly towards and away from the wafer positioning assembly, a dice pick and lift head being positioned on the carrier assembly and configured to engage the pre-selected dice when the carrier assembly is in a lowered position and to release said pre-selected dice when the carrier assembly is in a raised position.

The dice conveyance mechanism may include a gantry assembly positioned on the support assembly and having a gantry member that spans the wafer assembly, a shuttle assembly configured to receive and support the pre-selected dice being mounted on the gantry member and being displaceable relative thereto between a receiving position to receive the dice released by the dice picking assembly and a delivery position in which the dice are delivered to the placement assembly.

According to a second aspect of the invention, there is provided a transfer apparatus for transferring a component of integrated circuitry from a receiving location to a delivery location within an integrated circuitry assembly machine, the transfer apparatus comprising a support structure that defines a transfer path between said locations;

a component carrier that defines a receiving zone configured to receive the component of integrated circuitry;

a retaining mechanism arranged on the component carrier to retain the component of integrated circuitry in position in the receiving zone, the retaining mechanism being operable to release the component at the delivery location; and a displacement mechanism engaged with the component carrier to displace the component carrier along said transfer path.

The support structure may include a support arm extending between said receiving and delivery locations such that the transfer path is linear, the displacement mechanism including a linear motor arranged on the support arm.

The component carrier may include a shuttle plate, the receiving zone being defined by a vacuum plate arranged on the shuttle plate, the retaining mechanism including a gel pack for retaining the component of integrated circuitry.

The component carrier may include a vacuum tube arranged in fluid communication with the vacuum plate, said tube arranged in fluid communication with a vacuum pump operable to draw air through apertures defined in the vacuum plate to operatively retain the component of integrated circuitry to said vacuum plate.

The displacement mechanism may include a linear motor positioned on the support structure, said linear motor configured to displace the component carrier along the transfer path.

According to a third aspect of the invention, there is provided a die picker for picking printhead integrated circuitry from a wafer, said picker comprising:

a wafer platform having a displacement actuator to displace said platform which operatively receives the wafer;

a picker head having a vacuum mechanism to lift a dice of the circuitry from said wafer;

an alignment sensor configured to detect a position of the dice on the wafer; and a controller arranged in control signal communication with the displacement actuator, the picker head and the sensor to facilitate aligning the wafer with the picker head, and to pick the dice from the wafer with the head for transport to a transfer apparatus.

The displacement actuator may include two piezo motor stages attached to the platform to move the platform in a plane below the picker head. The displacement actuator may include a rotary axis motor configured to rotate the wafer platform below the picker head.

The wafer platform may include a heater plate configured to heat the wafer to soften an adhesive holding the dice to the wafer, with a vacuum plate to retain said wafer to the platform. The alignment sensor may include a camera with a lens adapter and prism to focus on identifying indicia on said wafer to facilitate the controller aligning the picker head with the dice.

The controller may operatively execute a set of instructions according to a predetermined wafer substrate mapping scheme to align the wafer with the picker head. The picker head may include a heater element to heat the dice to soften an adhesive holding the dice to the wafer prior to lifting said dice from the wafer.

According to a fourth aspect of the invention, there is provided a dice placement assembly for placing an integrated circuit dice on a carrier, said assembly comprising:

a support platform with a clamp mechanism configured to clamp the carrier onto said platform;

at least one camera operatively directed at the platform to detect alignment fiducials on the carrier;

a placement device having a vacuum mechanism to retrieve the dice from a supply mechanism, said placement device having actuators to align the dice with the carrier and to place the dice thereon once aligned, and a heater to heat the dice prior to placement on the carrier; and a controller operatively controlling the clamp mechanism, the camera and the placement device, to facilitate accurate placement of the dice on the carrier.

Preferably, the integrated circuit dice are inkjet printhead dice.

The camera may include a camera module linked to a prism by means of an adapter tube to focus said camera on the test bed. The support platform may include a pneumatically operated self-leveling platform controlled by the controller.

The actuators of the placement device may include three stepper motors each separately responsible for vertical, horizontal and angular alignment of the dice with the test bed, respectively. The actuators of the placement device may include a linear translation stage for moving the dice in a vertical direction for placing the dice onto the test bed.

The placement device may include a heated air blower configured to direct heated air at the dice prior to the placement device placing the dice onto the test bed. The placement device may include a lighting arrangement for illuminating the test bed to assist the camera in detecting the alignment fiducials.

According to a fifth aspect of the invention, there is provided a method of attaching integrated circuit dice to a carrier, said method comprising:

scanning a wafer having a number of circuitry dice formed thereon to demarcate respective dice;

aligning a die picker with a dice on the wafer according to a wafer substrate mapping scheme;

removing the dice from the wafer with the die picker;

transporting the dice to a placement station operatively positioning the carrier;

aligning the dice with the carrier; and heat bonding the dice to the carrier.

Preferably, the integrated circuit dice are inkjet printhead dice.

Preferably, the step of scanning includes scanning the wafer with a camera arrangement to identify fiducial marks on the wafer.

Preferably, the step of removing the dice includes heating the wafer and applying a vacuum to the respective dice targeted for removal with the die picker.

Preferably, the step of transporting the dice includes depositing the dice onto a shuttle assembly of an assembler displaceable between a receiving position where the dice is received and a delivery position in which the dice is delivered to a placement assembly.

Preferably, the step of aligning the dice with the carrier includes scanning the dice and the carrier with a camera arrangement to identify fiducial markings on both said dice and carrier, and displacing the dice relative to the carrier until the fiducial markings on the dice is in a predetermined position relative to the fiducial markings of the carrier.

Preferably, the step of identifying the fiducial markings includes examining the carrier with a camera having a focusing lens arrangement to identify microscopic apertures in a surface of the carrier, said apertures identified as the fiducial markings.

Preferably, the respective steps are performed by a controller of an assembler having a wafer positioning assembly, a dice picking assembly, a dice conveyance mechanism, and a dice placement assembly for implementing such steps according to a set of instructions included in a software product.

According to a sixth aspect of the invention, there is provided a wafer positioning assembly for an assembler for assembling integrated circuit dice on a carrier, said assembler having an enclosure with a support assembly for operatively supporting a wafer with dice thereon, a die picking assembly for picking dice from said wafer, a die placement assembly for placing the dice onto the carrier, a die conveyance mechanism operatively conveying the dice from the die picking and placement assemblies, and a control system controlling the assembler, said wafer positioning assembly comprising:
- a displacement assembly having a base plate with first and second stages mounted thereon; and
- a wafer support plate assembly rotatably mounted on the second stage, the support plate assembly configured to receive the wafer and having a motor under control of the control system to rotate the support plate assembly underneath the die picking assembly.

Preferably, the integrated circuit dice are inkjet printhead dice.

Preferably, the first stage is interposed between the base plate and the second stage, the first stage slidably mounted on the base plate along a first axis, the second stage slidably mounted on the first stage along a second axis perpendicular to the first axis.

Preferably, the assembly has a first piezo motor interconnecting the base plate and the first stage, said first motor under control of the control system to displace the first stage along the first axis.

Preferably, the assembly has a second piezo motor interconnecting the first stage and the second stage, said second motor under control of the control system to displace the second stage along the second axis.

Preferably, the wafer support plate assembly includes a bearing table rotatably mounted to the second stage, the wafer support plate assembly having a bearing retainer sandwiched between the second stage and said bearing table to ensure smooth rotation of the wafer support plate assembly on the second stage.

Preferably, the wafer support plate assembly includes a rotating pin with a compression spring about said pin, the compression spring provides dampening for vertical movement of the wafer support plate assembly on the second stage.

Preferably, a heater plate is mounted on the bearing table with spacers to provide thermal isolation between the heater plate and bearing table, a vacuum plate mounted on, and fast with, the heater plate.

Preferably, both the vacuum plate and the heater plate define a number of vacuum apertures, vacuum tubes being connected to an underside of the heater plate in fluid communication with the vacuum apertures, the tubes connected to a vacuum manifold connected to a vacuum pump of the assembler, operation of the vacuum pump retaining the wafer to the vacuum plate.

Preferably, a heater cartridge is interposed between the vacuum plate and the heater plate, said heater cartridge connected to a heated air supply of the assembler so that the heater plate is able to heat the wafer.

Preferably, a stepper motor assembly is mounted on the second stage, a power screw of the stepper motor assembly extending from the stepper motor to engage the wafer support plate assembly in a tangential manner.

Preferably, a working end of the power screw is fast with a connector arm extending from the bearing table, so that extension and retraction of the power screw causes the wafer support plate assembly to rotate anti-clockwise and clockwise, respectively.

According to a seventh aspect of the invention, there is provided a dice pick and lift head for an assembler for assembling integrated circuit dice on a carrier, said assembler having an enclosure with a support assembly for operatively supporting a wafer with dice thereon, a die picking assembly for picking dice from said wafer, a die placement assembly for placing the dice onto the carrier, a die conveyance mechanism operatively conveying the dice from the die picking and placement assemblies, and a control system controlling the assembler, said dice pick and lift head comprising:
- a first translation stage mounted to the die picking assembly, said first translation stage operatively displaceable along a vertical axis relative to the support assembly;
- a second translation stage mounted to the first translation stage, said second translation stage operatively displaceable along a horizontal axis relative to the support assembly; and
- a die picker head mounted to the second translation stage, the picker head defining a vacuum chamber and a dice contact surface having vacuum apertures in fluid communication with the vacuum chamber.

Preferably, the integrated circuit dice are inkjet printhead dice.

Preferably, the first translation stage includes a stepper motor under control of the control system, the motor having a linear encoder to provide positional feed back values of the picker head to the control system.

Preferably, the linear encoder is arranged proximate scale tape fast with the die picking assembly to facilitate the linear encoder generating the positional feed back values.

Preferably, the second translation stage includes a pair of micrometer drives fast with the first stage to displace the pick head the horizontal axis, said drives under control of the control system.

Preferably, the die picker head includes a pair of sealing strips positioned on respective sides of the vacuum apertures on the dice contact surface to facilitate the generation of a vacuum between a dice to be lifted and the dice contact surface.

Preferably, the dice pick and lift head has a vacuum tube fast with the vacuum body, the tube connected to a vacuum pump under control of the control system configured to generate a vacuum in the chamber when the contact surface touches a dice.

Preferably, a heater cartridge is positioned in the vacuum body and is connected to a heated air supply to heat the dice contact surface, a thermocouple being connected to the contact surface to sense the temperature thereof and report the sensed temperature to the control system.

According to an eighth aspect of the invention, there is provided a placement head for a die placing assembly of an assembler for assembling integrated circuit dice on a carrier, said assembler having an enclosure with a support assembly for operatively supporting a wafer with dice thereon, a die picking assembly for picking dice from said wafer, a die placement assembly for placing the dice onto the carrier, a die conveyance mechanism operatively conveying the dice from the die picking and placement assemblies, and a control system controlling the assembler, said placement head comprising:
- a first translation stage mounted on the die placement assembly, said first stage operatively displaceable along a first axis relative to the die placement assembly;
- a second translation stage mounted on the first stage, the second stage displaceable perpendicular to the first stage;
- a third translation stage mounted on the second stage, the third stage displaceable orthogonally to the first and second stages; and a die placer head mounted to the third stage, the placer head shaped and dimensioned to operatively receive a die from the dice conveyance mechanism and to place the dice onto the carrier.

Preferably, said integrated circuit dice are inkjet printhead dice.

Preferably the placement head has an angular motor mounted through the third stage in contact with the die placer head, so that actuation of the angular motor by the control system causes angular pivoting of the die placer head about an axis in which the second stage translates.

Preferably the placement head has an angular movement spring fast with the third stage, the spring configured to bias the placer against angular movement provided by the angular motor.

Preferably the placement head has a placement head mounting block assembly which includes a mounting plate, said placement head fast with an upright portion of a frame of the die placing assembly via said mounting plate.

Preferably the placement head has a first stage stepper motor fast with the block assembly via a bracket assembly, the first stage stepper motor having a pushrod that operatively engages the first stage to push the first stage along a first axis with respect to the block assembly.

Preferably the placement head has a second stage stepper motor fast with the first stage via a bracket assembly, a push bracket fast with the second stage and engaging a pushrod of the second stage stepper motor via a compression spring, a linear encoder mounted on the first stage with scale tape fast with the second stage to be read by said linear encoder to provide positional feedback along the second axis to the control system.

Preferably the placement head has a pair of third stage micrometer drives mounted on the second stage and engaged with the third stage to provide adjustment of the third stage, said micrometer drives under control of the control system.

Preferably, the die placer head defines an aperture in fluid communication with a vacuum tube connected to a vacuum pump of the assembler, the aperture shaped and dimensioned to receive a die from the wafer, the die operatively held in the aperture by said vacuum pump.

According to a ninth aspect of the invention, there is provided clamp assembly for an assembler for assembling printhead integrated circuitry on a carrier, said assembler having an enclosure with a support assembly for operatively supporting a wafer with dies thereon, a die picking assembly for picking dice from said wafer, a die placement assembly for placing the dies onto the carrier, a die conveyance mechanism operatively conveying the dies from the die picking and placement assemblies, and a control system controlling the assembler, said clamp assembly comprising:

an elongate clamp body, the body shaped and configured to be received by the die placement assembly;

a pair of elongate retaining plates mounted on top of the body;

an insert shaped and dimensioned to be received in the body below the plates, the insert operatively receiving said carrier; and a diaphragm positioned in the body, the diaphragm pneumatically displaceable to operatively urge the insert against the retaining plates.

The insert may include a number of locating dowels for complementarily engaging associated apertures defined in the carrier to ensure that the carrier is correctly positioned.

The insert may be slidably receivable in the body, said body including an insert stop at one end thereof with a proximity switch mounted on the stop and configured to generate a signal for the control system when the insert reaches the stop.

The plates may be mounted on the body to define an access gap of sufficient width to permit positioning of the printhead integrated circuitry on the carrier via said gap.

The body may include a pneumatic fitting and define pneumatic chamber to facilitate pneumatic actuation of the diaphragm via a pneumatic system of the assembler.

The clamp assembly may include a handle fast with the insert to facilitate manipulation of the carrier into position between the clamp plates.

According to an tenth aspect of the invention there is provided a software product for execution by a processor, said software product having instructions configured to enable the processor to perform the steps of the above method.

According to an eleventh aspect of the invention there is provided a computer readable medium operatively storing a software product for execution by a processor, said software product having instructions configured to enable the processor to perform the steps of the above method.

BRIEF DESCRIPTION OF THE DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows:

FIG. 11 shows a close-up view of part of a die picker of the pick and lift head shown as "A" in FIG. 10;

FIG. 12 shows an embodiment of a camera arrangement of the die picking assembly of FIG. 4;

DETAILED DESCRIPTION

Aspects of the invention are described below with reference to specific embodiments thereof. Reference to "an embodiment" or "one embodiment" is made in an inclusive rather than restrictive sense. As such, reference to particular features found in one embodiment does not exclude those features from other embodiments.

The following description is intended to assist a person skilled in the art with understanding the invention. Accordingly, features commonplace in the art are not described in particular detail, as such features will be readily understood by the skilled person.

Overview

In broad terms, the invention relates to the assembly of printhead integrated circuitry on a test bed or carrier. The assembly typically comprises removing dice from a wafer and placing said dice onto the carrier or test bed with a high degree of accuracy.

Figure 1:
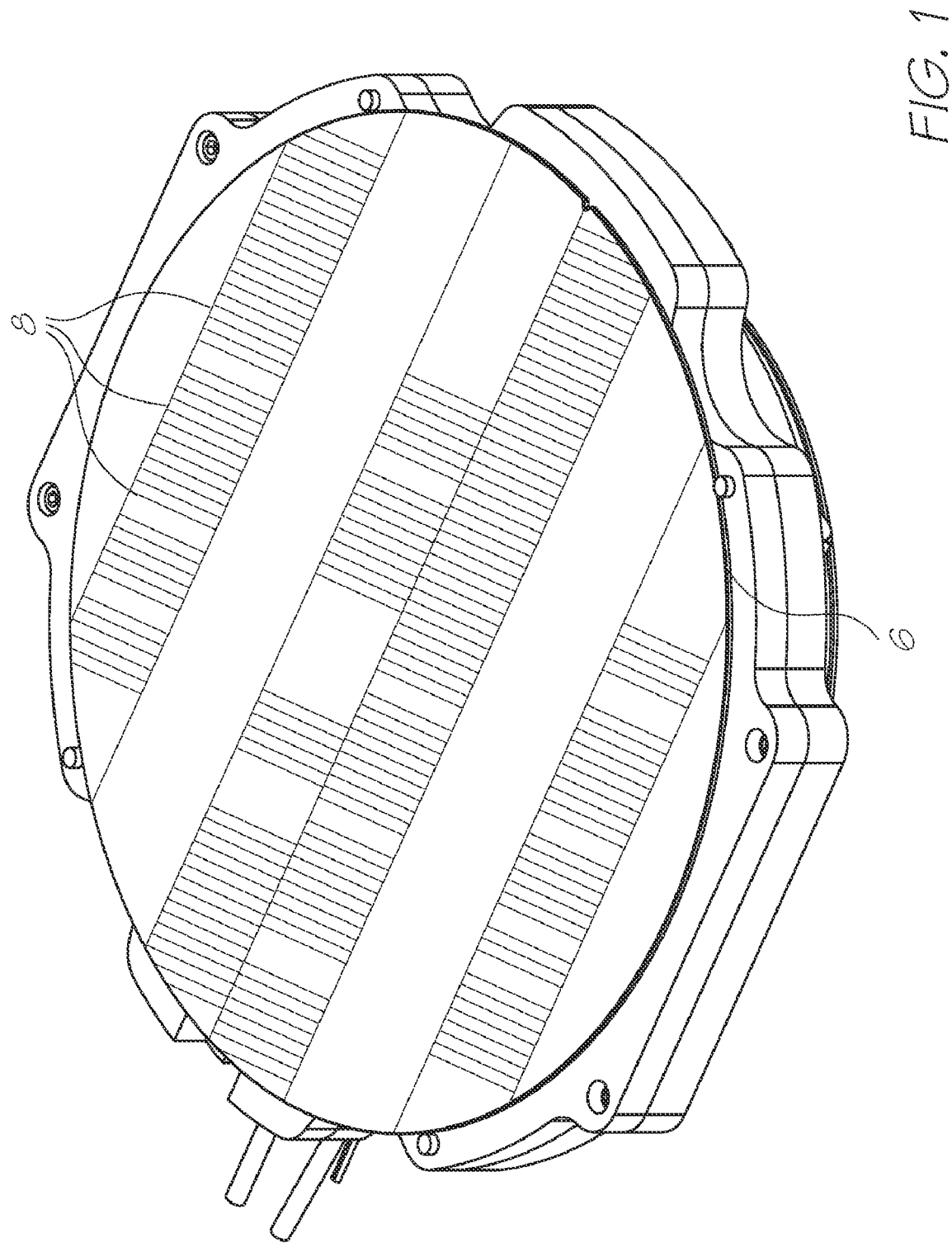
FIG. 1 shows an example of a wafer that defined a plurality of printhead integrated circuits (ICs) or dice.

The printhead integrated circuitry includes a series of printhead integrated circuits (ICs) which have a plurality of micro-electromechanical nozzle arrangements that eject microdots of ink onto a printing surface. The ICs define a number of microscopic ink inlets which lead to respective nozzles, said inlets arranged in fluid communication with an ink distribution assembly. The ink distribution assembly is responsible for feeding ink to the ICs. An example of a wafer 6 is shown in FIG. 1. As shown, the wafer 6 includes a plurality of printhead ICs or dice 8 thereon. The wafer 6 is a product of various etching and lithography processes common in IC manufacturing.

In order to test a printhead IC, each IC is mounted to the carrier, which defines a number of tortuous ink paths therein to form such an ink distribution assembly. The ink paths terminate as microscopic ink outlets in a surface of the carrier. Given the microscopic sizes of the ink inlets of the ICs and the ink outlets, accurate and precise alignment of the ICs with the carrier is vitally important. The invention provides for an assembler and related apparatus and techniques used to accurately fasten the ICs to the carrier.

Carrier 10

Figure 2:
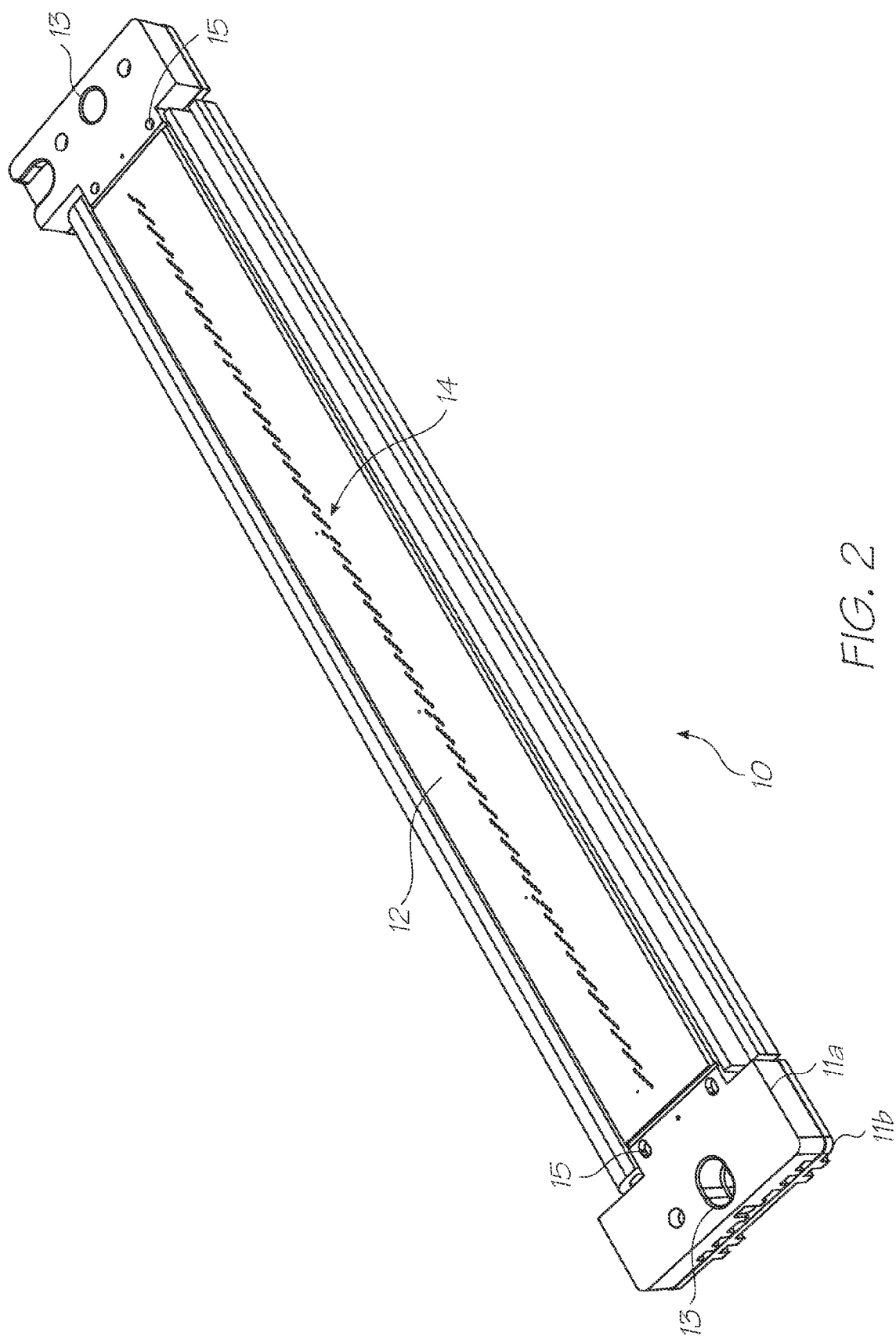
FIG. 2 shows a perspective view of a carrier or test bed on which the printhead integrated circuits (ICs) are to be placed or assembled.

FIG. 2 shows an embodiment of such a carrier 10. It is to be appreciated that the terms carrier, test bed, base assembly, carrier sub-assembly, liquid crystal polymer (LCP) assembly, or platform substructure 10 referred to herein all make reference to the same element indicated by reference numeral 10. The carrier 10 is generally an assembly of two liquid crystal polymer (LCP) micro-moldings 11a and 11b. The micro-moldings 11 define a plurality of discrete tortuous ink paths for ducting ink from an ink reservoir (not shown) to printhead integrated circuitry (not shown).

Accordingly, the carrier or test bed 10 is used to test the operation of prototyped of such printhead integrated circuitry (IC) prior to mass production of the ICs. Given the operation of these printhead ICs, it is generally necessary to establish a seal between the tortuous ink paths defined in the carrier 10 and fluid inlets of the ICs. For this reason, the Inventor has found that by laminating the carrier 10 with a lamina film 12, such a fluid tight seal can be established between the carrier 10 and IC when the IC is fastened to the carrier 10. This facilitates fluid-tight supplying of ink to the printhead ICs.

The ink paths through the carrier 10 typically terminate as fiducial apertures or "fiducials" 14 in a surface of the carrier 10, shown in FIG. 1. It is therefore necessary to place the ICs on the carrier 10 without blocking or impeding these fiducials 14, otherwise ink will be prevented from flowing through the carrier 10 to the printhead ICs.

The carrier 10 also defines two location openings 13 at respective opposite ends, as shown. The purpose of the location openings 13 is to accurately fix and align the carrier 10 in a clamp prior to placing the ICs thereon. Also included are carrier fiducials 15 to assist in aligning the carrier 10 prior to fastening the ICs thereon.

Overview of Assembler 16

Figure 3:
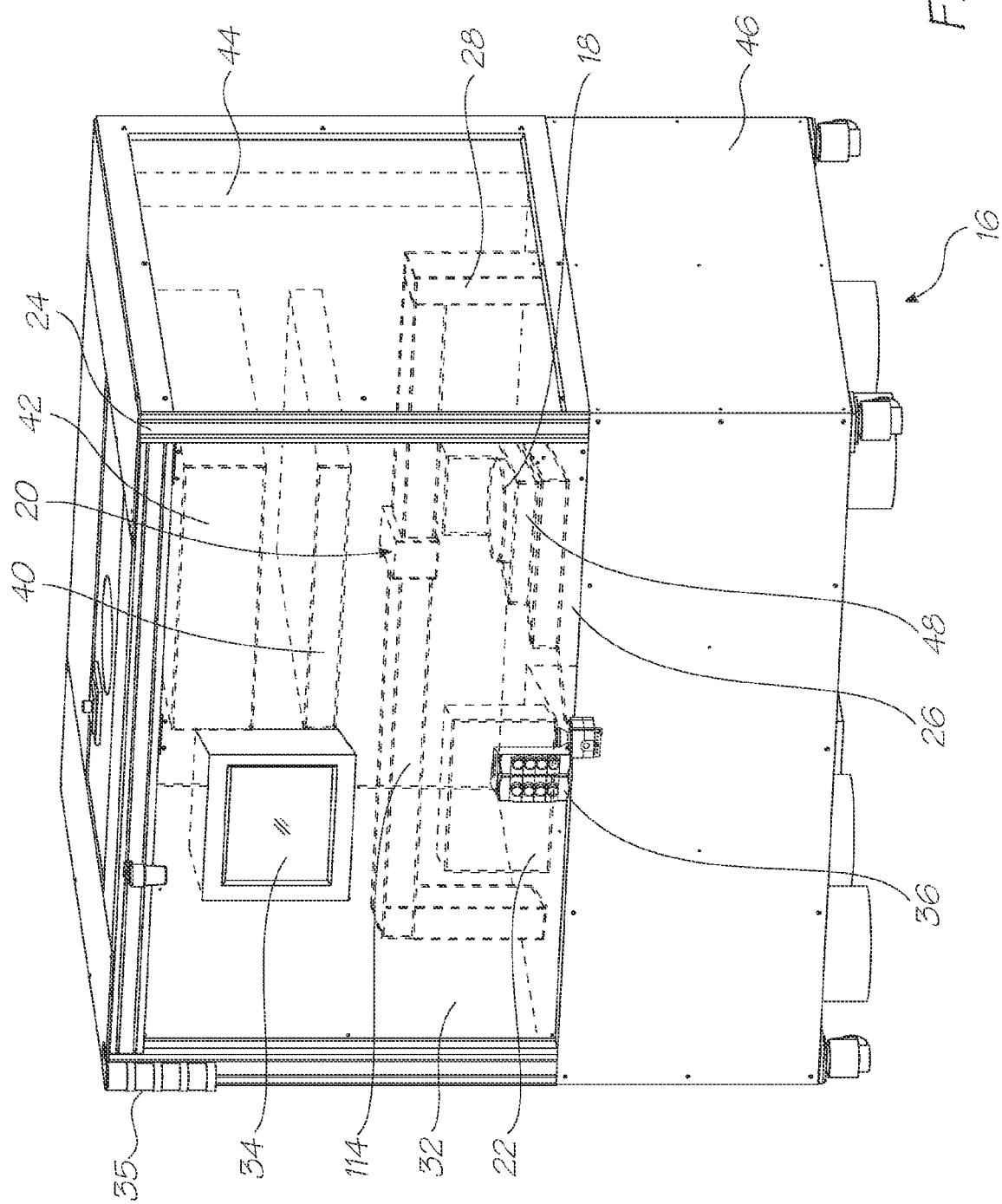
FIG. 3 shows a perspective view of one embodiment of an assembler for assembling the ICs on the carrier.

In FIG. 3, there is shown an embodiment, in accordance with one embodiment of the invention, of a printhead assembly machine or assembler 16. Physically, the printhead assembly machine 16 includes a support assembly or structure 24 defining a main enclosure 25 having a support frame 27 and side window panels 29, as shown. The side panels 29 are typically transparent to allow an operator of the assembler 16 to see inner workings thereof. Front panel 32 is indicated, with representations of the inner components viewable therethrough, as shown.

The internal components of the assembler 16 includes a die picking assembly or die picker 18, with wafer positioning assembly 17, in accordance with one embodiment of the invention, a transfer apparatus or die conveyance mechanism 20, in accordance with one embodiment of the invention, and a die placement assembly 22, also in accordance with one embodiment of the invention.

The support structure includes a self-leveling optical table 26 supported by the support frame 27 in the enclosure 25. The dice picking assembly 18 is mounted on the optical table 26 and is described in detail below. The dice picking assembly 18 is configured to pick dice from the wafer 6 loaded into the enclosure 25. The panels of the enclosure 25 are typically slidable to facilitate such loading of the wafer 6 and carrier 10. The dice placement assembly 22 is also mounted on the optical table 26 and is described in detail below. The die placement assembly 22 is configured to dice 8 on the carrier 10.

The dice conveyance mechanism or shuttle transfer assembly 20 is interposed between the dice picking assembly 18 and the dice placement assembly 22. The dice conveyance mechanism 20 includes a gantry beam 114, which is described in more detail below. The dice conveyance mechanism 20 is configured to receive a die from the dice picking assembly 18 and to transfer said dice to the dice placement assembly 22. The dice conveyance mechanism 20 includes a transfer or shuttle gantry 28 mounted on the optical table 26. The gantry 28 extends from the dice picking assembly 18 to the dice placement assembly 22.

A touch panel PC 34 is mounted on the frame of the housing 24 and is positioned to be accessed by an operator. A control panel 36 is also mounted on the frame to be accessed by an operator. A light beacon 35 is also mounted on the enclosure 24 to show an operating state of the assembler 16. Together, the touch panel PC 34 and the control panel 36 constitute an operator interface whereby an operator can monitor and control the working of the assembler 16. It is however to be appreciated that most of the assembler's functions are monitored and controlled by a controller or control system, described below, which includes a PLC (programmable logic controller) 38. The operator interface allows an operator to start and stop the assembler 16, with additional low-level control.

An ionizer bar 40 is positioned in the enclosure 24 together with a HEPA fan/filter arrangement 42 to achieve a suitable environment in the enclosure. An electrical enclosure 44 is mounted on the support frame and encloses the various electrical components for operation of the printhead assembly machine 16, as described below. The housing 24 also includes a pneumatic enclosure 46 which encloses the various pneumatic components for operation of the machine 16, described in more detail below.

Die Picking Assembly 18

Figure 4:
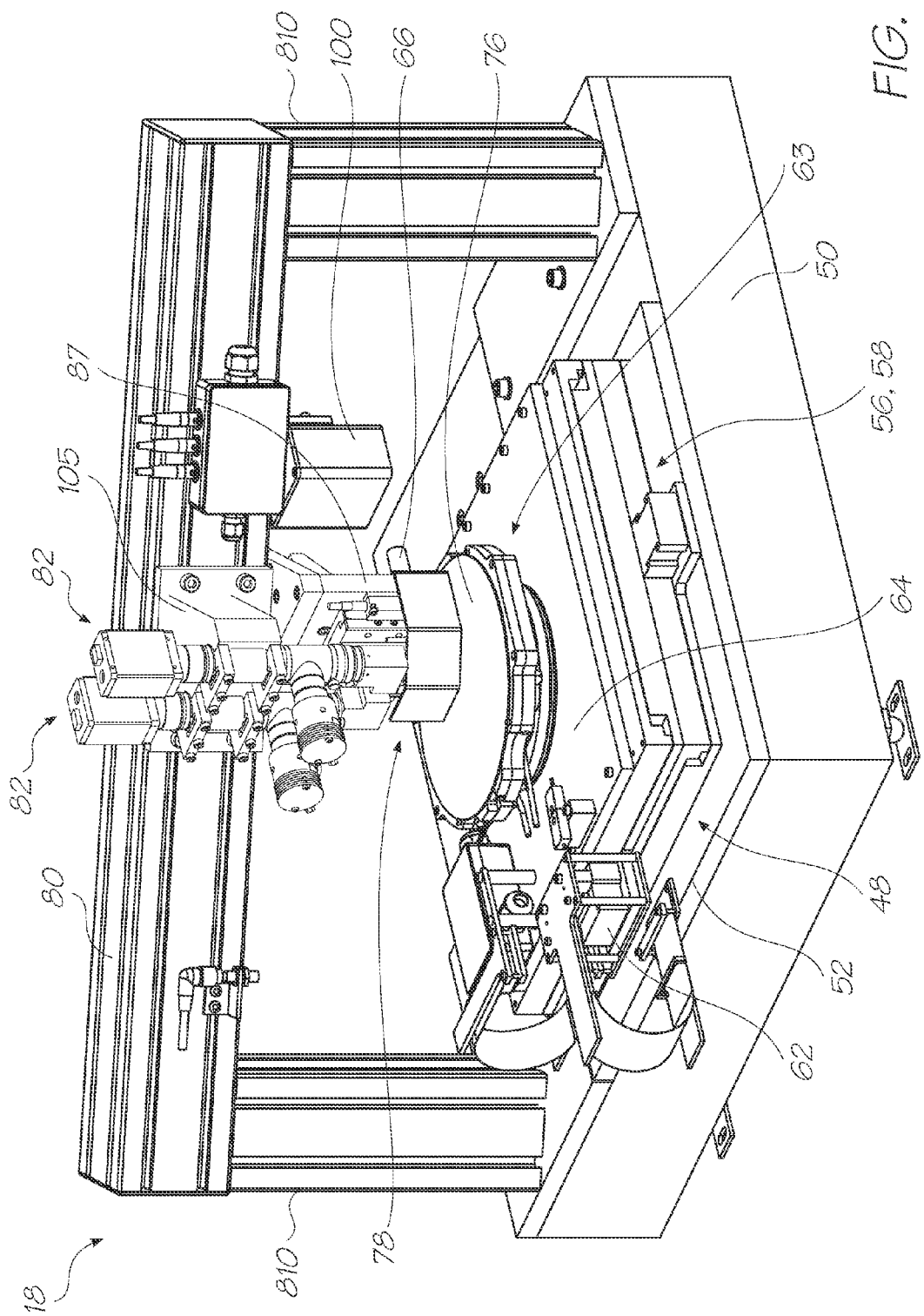
FIG. 4 shows a perspective view of a dice picking assembly or dice picker, in accordance with one embodiment of the invention, for picking ICs from the wafer.

Referring now to FIG. 4, the purpose of the die picking assembly 18 is to select a die from the wafer 6, which is operatively secured to a wafer support plate assembly 63, according to a predetermined pick list and to lift it and place the die in the shuttle transfer assembly 20.

The die picking assembly 18 includes a block mounting member 50 in the form of a block of granite mounted on the optical table 26. The block 50 is typically rectangular, as shown. A wafer positioning assembly 48 is mounted on the block 50.

The wafer support plate assembly 63 enables the wafer 6 to be held in position by means of a vacuum. A heater plate 71 is used to heat the wafer 6 under control of the PLC 38 via the thermocouple 79 to loosen an adhesive holding the dies or IC's 8 to the wafer, so that a dice pick and lift head 78 is able to pick a die from said wafer 6. A pick head gantry 80 is also mounted on the block 50.

As shown, the gantry 80 includes a pair of opposed gantry posts 810 mounted on opposite corners of the block 50. The gantry 80 spans the wafer positioning assembly 18 and supports the die pick and lift head 78 with a suitable bracket 87. The head 78 includes a pair of spaced wafer camera and optic assemblies 82. The assemblies 82 are connected to the PC 34 which is configured to receive image data representing the wafer 6 and to control movement of the wafer support plate assembly 63, to align successive dies 8 with the head 78. Also included is wafer scribe reader 100.

The respective assemblies are discussed in more detail below.

Wafer Positioning Assembly 48

Figure 5:
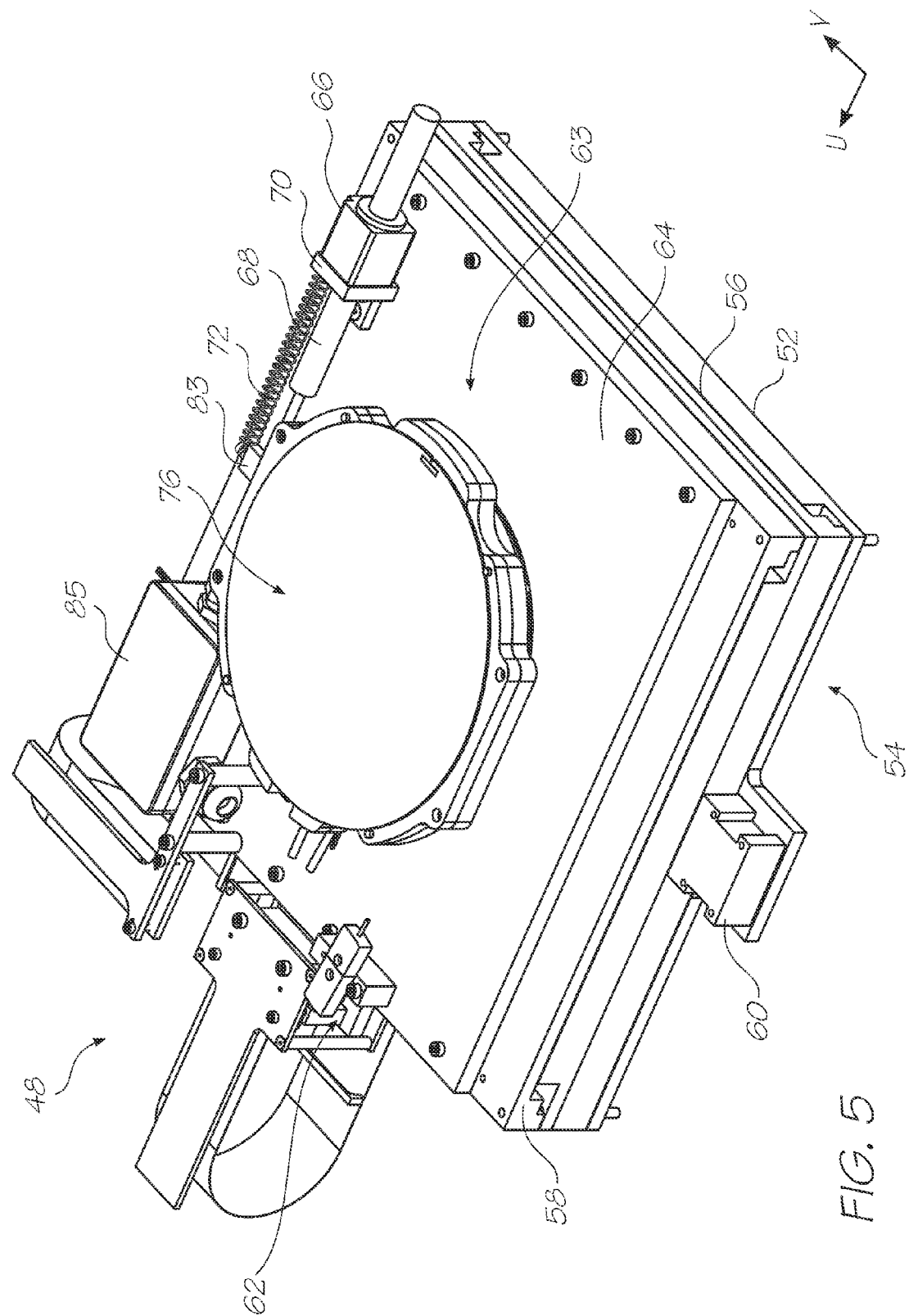
FIG. 5 shows a wafer positioning assembly, in accordance with one embodiment of the invention, of the picker of FIG. 4.

The wafer positioning assembly 48, shown in more detail in FIG. 5, includes a base member or plate 52 mounted on the block 50. A displacement assembly 54 is mounted on the base plate 52. The displacement assembly 54 includes two stages 56 and 58, with a first stage 56 interposed between the base plate 52 and a second stage 58.

The first stage 56 is displaceable relative to the base member 52 along a first or U-axis. A first piezo motor 60 interconnects the base plate 52 and the first stage 56. Thus, the first piezo motor 60 displaces the first and second stages along a V-axis with respect to the base plate 52. The second stage 58 is displaceable relative to the first stage 56 along a U-axis. A second piezo motor 62 interconnects the first and second stages. Thus, the second piezo motor 62 displaces the second stage 58 along the U-axis with respect to the first stage 56.

The piezo motors 60 and 62 are connected to the PLC 38, with suitable controllers described below to control operation of the piezo motors. The PLC 38 and its manner of operation are described in more detail below.

Wafer Support Plate Assembly 63

Figure 6:
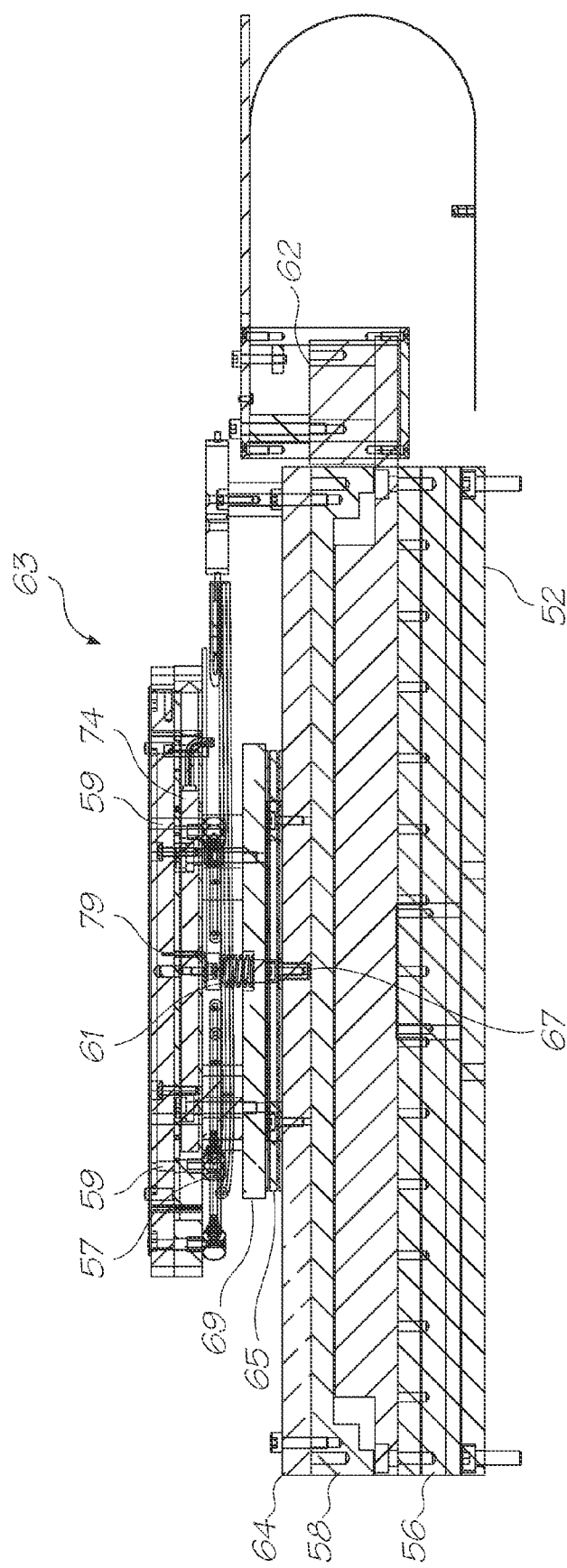
FIG. 6 shows a side sectioned view of the wafer positioning assembly shown in FIG. 5.

The wafer support plate assembly 63 is rotatably mounted on the second stage 58. The wafer support plate assembly 63 has a bearing table 69 (FIG. 6) rotatably mounted on a base plate 64 on top of the second stage 58. The wafer support plate assembly 63 includes a bearing retainer 65 sandwiched between the plate 64 and the bearing table 69 to ensure smooth rotation of the wafer support plate assembly 63. The wafer support plate assembly 63 includes a rotating pin 67 with compression spring 61 about which the wafer support plate assembly 63 can rotate on the base plate 64. Compression spring 61 provides dampening of vertical movement of the wafer support assembly 63.

The heater plate 71 is mounted on the bearing table 69, with spacers 75 (FIG. 7) for thermal isolation. In turn, the bearing table 69 is mounted on the base plate 64. A vacuum plate 76 is mounted on, and fast with, the heater plate 71. Both the vacuum plate and the heater plate 76 define a number of vacuum apertures 59. A number of vacuum tubes 57 are connected to an underside of the heater plate 71 in fluid communication with the vacuum apertures 59, as shown. The tubes 57 are connected to a vacuum manifold 55 connected to a vacuum pump 472 housed in the pneumatic enclosure 46, described below. Supply tubes 77 connect the vacuum pumps 472 with the manifold 55, as shown. Operation of the vacuum pumps 472 is controlled so that when a wafer is positioned on the vacuum plate 76, the wafer can be retained in position by a vacuum generated by the vacuum pumps 472.

A heater cartridge 74 is interposed between the vacuum plate 76 and the heater plate 71. The heater cartridge 74 is connected to a heated air supply so that the heater plate 71 can heat the wafer 6 to loosen an adhesive holding the dies or IC's 8 to the wafer 6, in use. A thermocouple 79 is connected to the heater plate 71 and operatively to the PLC 38 with controllers (as described below) so that a temperature of the heater plate 71 can be controlled with the PLC 38 and controllers via the heater cartridge 74.

Figure 7:
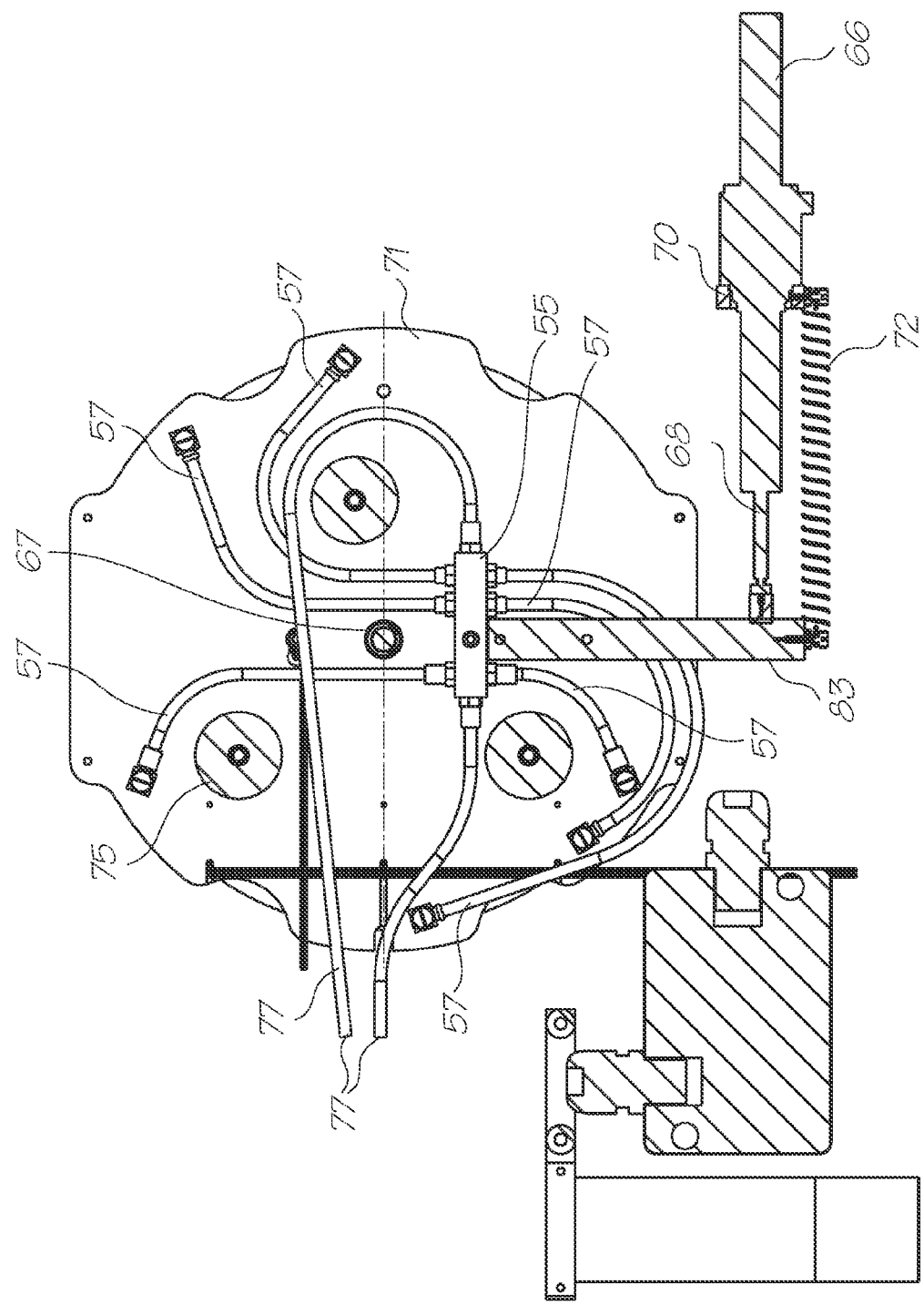
FIG. 7 shows an underside view of the wafer positioning assembly shown in FIG. 5.
Figure 8:
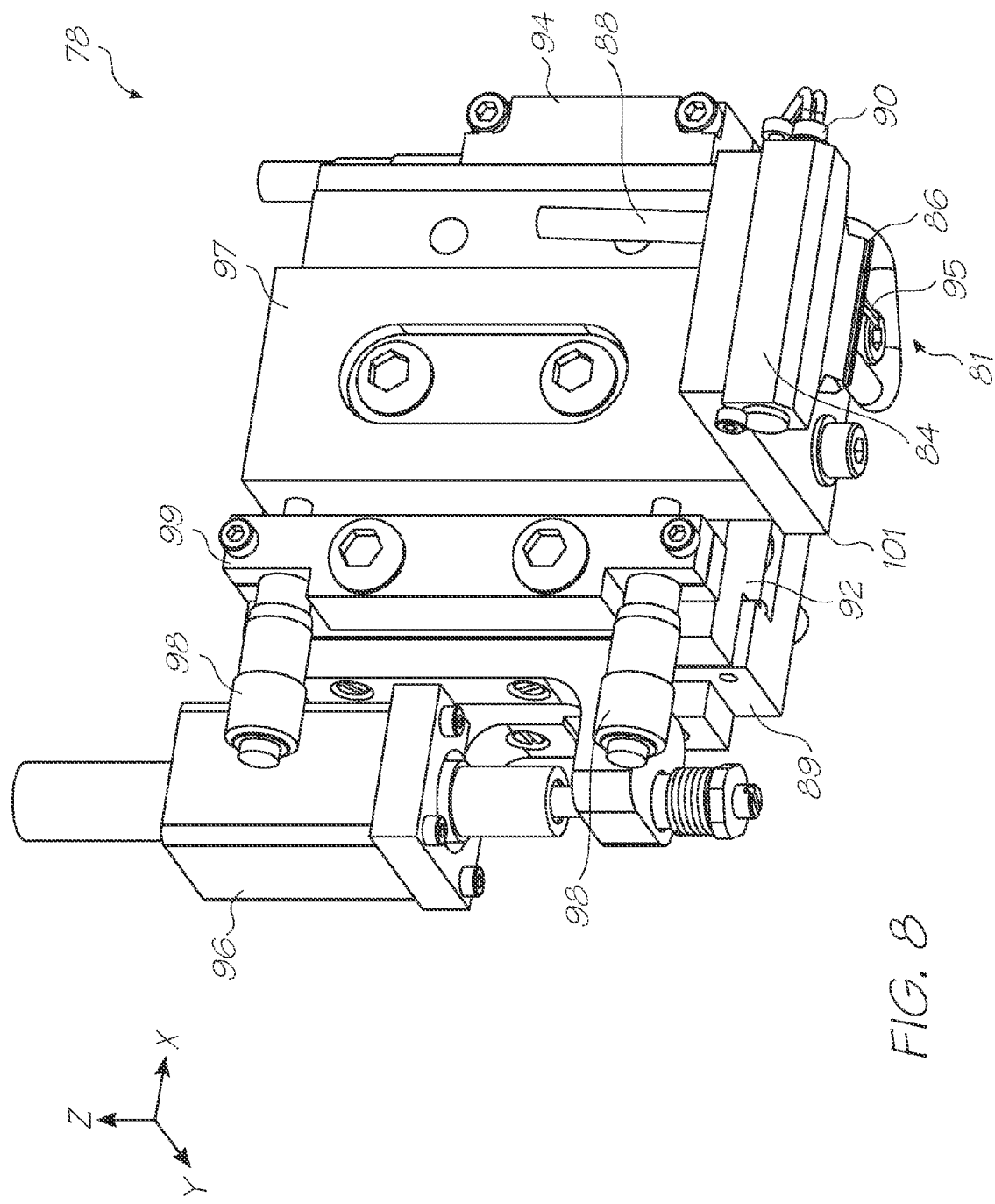
FIG. 8 shows a perspective view of a dice pick and lift head, in accordance with one embodiment of the invention, of FIG. 4.
Figure 9:
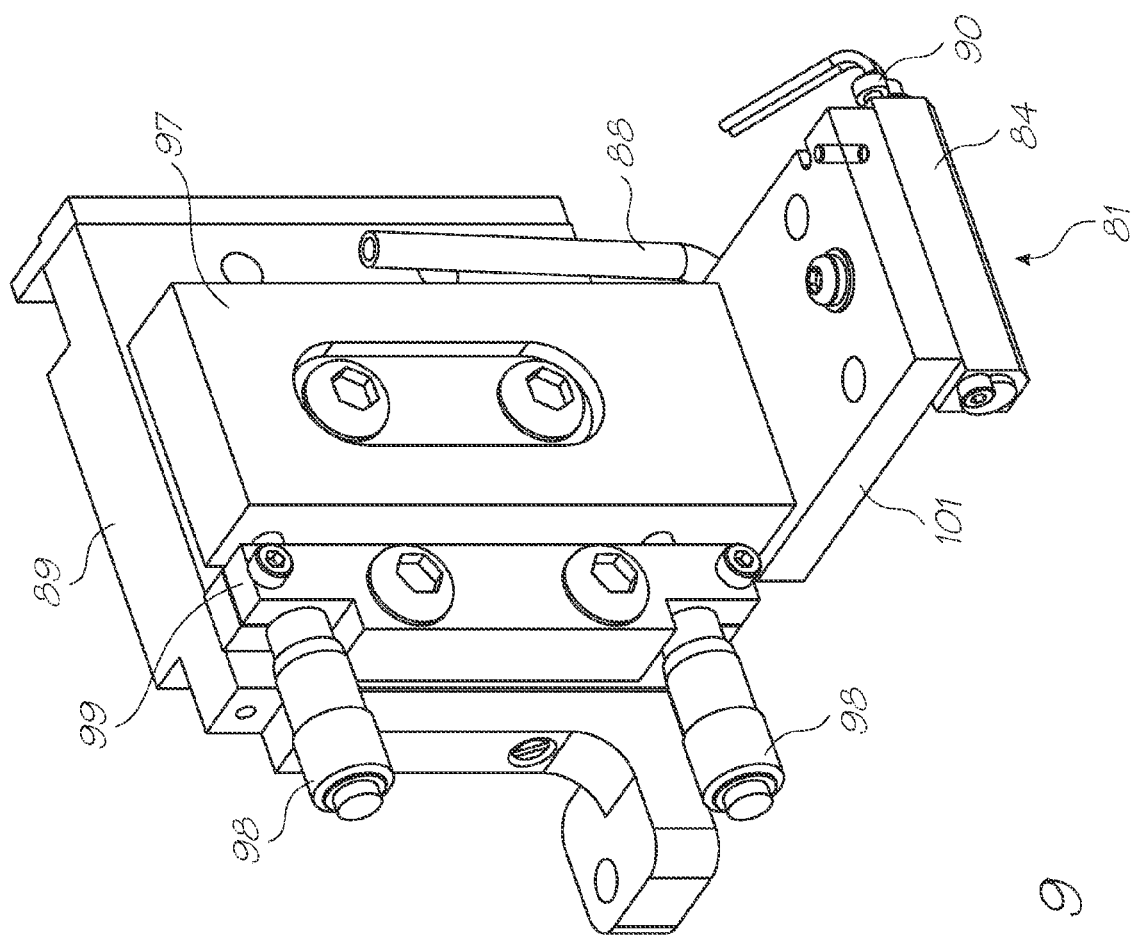
FIG. 9 shows a further perspective view of the dice pick and lift head shown in FIG. 8.
Figure 10:
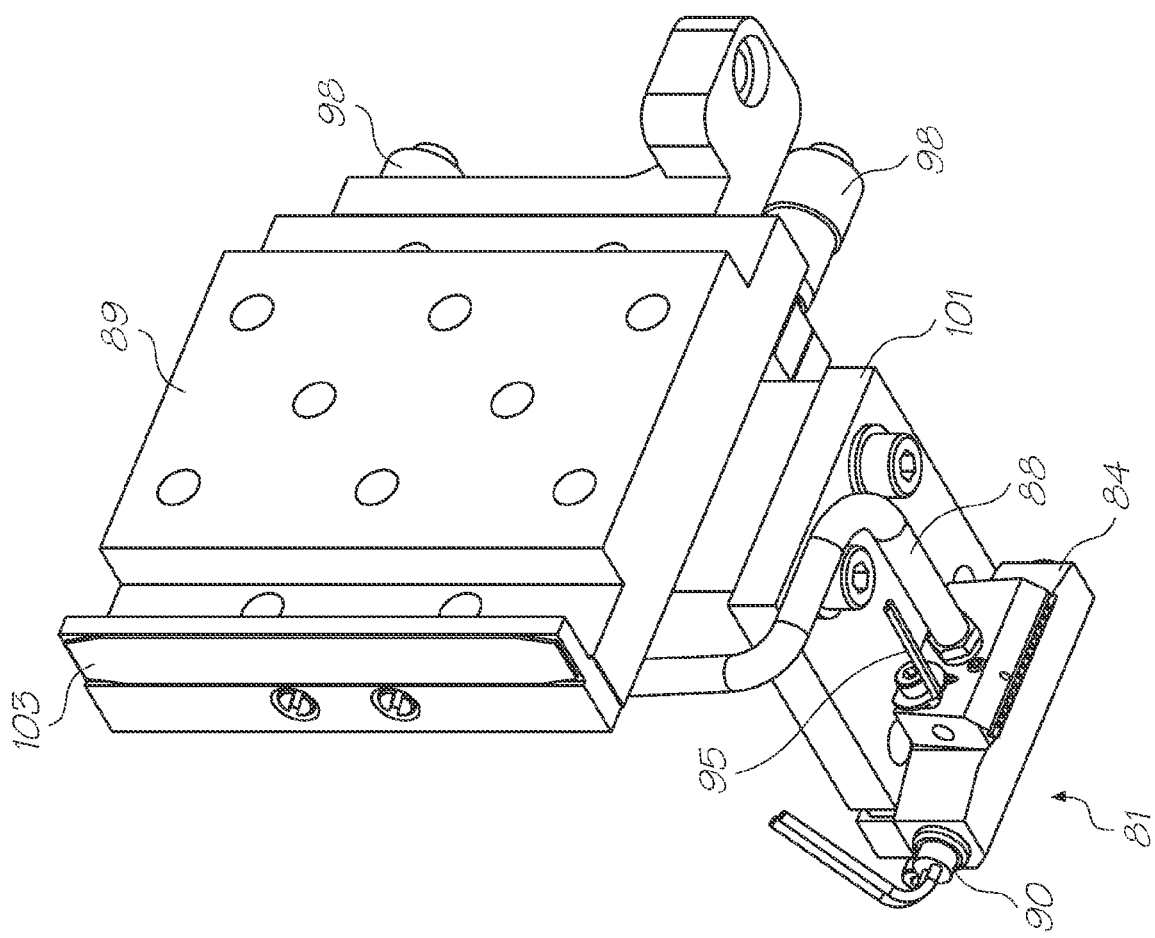
FIG. 10 shows a further perspective view of the die pick and lift head shown in FIG. 8.

A stepper motor assembly 66 is mounted on the second stage 58. A power screw 68 of the stepper motor assembly 66 extends from the stepper motor assembly and engages the wafer support plate assembly 63 in a tangential manner. In particular, and as can be seen in FIG. 7, a connector arm 83 is fast with, and extends radially from, the heater plate 71. A working end of the power screw 68 is fast with the connector arm 83 so that extension and retraction of the power screw 68 causes the wafer support plate assembly 63 to rotate anti-clockwise and clockwise, respectively, in the embodiment shown in the drawings. The power screw 68 is threaded through a screw plate 70 extending from the second stage 58. A spring 72 is fastened between the screw plate 70 and the connector arm 83. Thus, the wafer support plate assembly 63 can rotate in one direction under operation of the power screw 68 and in an opposite direction under spring action. The stepper motor assembly 66 is also connected to the PLC 38 with a suitable controller to control operation of the stepper motor assembly 66. An electrical box 85 facilitates the respective electrical connections of components to the PLC 38, described below and controller.

Dice Pick and Lift Head 78

The dice pick and lift head 78 is shown in more detail in FIGS. 8 to 11. The dice pick and lift head 78 includes a mount 89 fastened to the bracket 87 and displaceable along a Z axis (operatively vertically) relative to the bracket 87. The mount 89 and the bracket 87 are configured so that displacement of the mount 89 and bracket 87 is linear, the mount 89 defining a linear translation stage 92. A linear encoder 94 provides the necessary positional Z axis feed back values, facilitated by scale tape 103 (FIG. 10) to the PLC 38. Also included is a vertical stepper motor 96 fast with the bracket 87 and engaged with the mount 89 for displacing the die picker head along the Z axis under control of the PLC 38 using the positional feed back values from the linear encoder 94.

A pick head plate 97 is attached to the mount 89. The pick head plate 97 and the mount 89 are configured so that the pick head plate 97 is displaceable along an X axis (operatively horizontally) with respect to the mount 89. A drive bracket 99 is fast with the mount 89. A pair of micrometer drives 98 is fast with the bracket 99 and engage the pick head plate 97 to displace the pick head plate 97 along the X-axis. The drives 98 are connected to the PLC 38 to displace the pick head plate 97 under control of the PLC 38. Thus, the pick head plate 97 can be adjusted by the stepper motor 96 and micrometer drives 98 with two degrees of freedom under control of the PLC 38.

A die picker head (shown in further detail in FIG. 11) is fast with the pick head plate 97, via bracket 101, and has a vacuum body 84 that defines a vacuum chamber. The vacuum body 84 has a dice contact surface 86 that is configured to touch a dice to be lifted from the wafer 6 on the vacuum plate 76. The dice contact surface 86 defines a row of vacuum apertures 91 in fluid communication with the vacuum chamber of the vacuum body 84. A pair of sealing strips 93 is positioned on respective sides of the row of vacuum apertures 91 to facilitate the generation of a vacuum between a dice to be lifted and the dice contact surface 86.

A vacuum tube 88 is fast with the vacuum body 84 and is connected to a vacuum pump, under control of the PLC 38, to generate a vacuum in the chamber when the contact surface 86 touches the dice. A heater cartridge 90 is positioned in the vacuum body 84 and is connected to a heated air supply to heat the surface 86. A thermocouple 95 is connected to the surface 86 to sense the temperature thereof and report the sensed temperature to a controller (described in further detail below). In turn, the controller is configured to control the heated air supply to the cartridge 90 with a valve so that sufficient heat is generated to facilitate the separation of dies from the wafer 6 on the vacuum plate 76.

Camera and Optical Assembly 82

One embodiment of the camera and optical assembly 82 is shown in FIG. 12. In this embodiment, the camera assembly 82 is mounted on a camera bracket 105 fast with the gantry 80 (FIG. 4). As can be seen in FIG. 12, each camera assembly 82 includes a camera 102. A suitable camera is a black and white IEEE 1394 SXGA+ C-Mount camera with a Megapixel Sony ⅔" type progressive CCD array manufactured by Allied Vision (AVT F-131B).

The camera 102 is mounted on the end of an adapter tube 104 with a 2× lens adapter. A body tube 106 is, in turn, mounted on the adapter tube 104. The body tube 106 is in the form of a T-piece with an LED assembly 108 with cooling heatsink 110 for required illumination of the wafer 6. The camera assembly 82 also includes a prism 112, arranged at an end of the body tube 106. The camera assemblies 82 are configured to generate an image of portions of the wafer 6 for the PLC 38. The camera assemblies 82 are connected to the touch screen PC 34 so that the image can be displayed on a screen of the PC 34 (as described in further detail below). The PC 34 is programmed to identify wafer fiducial markings and thus to facilitate positioning of the pick head 78 according to a wafer map. This allows software controlling the assembler 16 to identify and select respective dies on the wafer 6 using the wafer map.

Wafer Scribe Reader 100

A wafer scribe reader 100 (FIG. 4) is also mounted on the gantry 80. The wafer scribe reader 100 is configured to use optical character recognition to read a wafer identity number on a wafer 6 loaded onto the wafer support plate assembly 63. The wafer identity number is associated with the location of a suitable die 8 to be lifted and the controlling software used for lifting the dice from the wafer.

The wafer scribe reader 100 is operatively connected to the PC 34. The PC 34 is programmed to generate a visible image of the wafer identity number. Furthermore, the PC 34 is programmed to generate a graphical user interface (GUI). Thus, if the scribe reader 100 has difficulty in reading the wafer identity number, an operator can use the GUI to input the wafer identity number manually.

Figure 13:
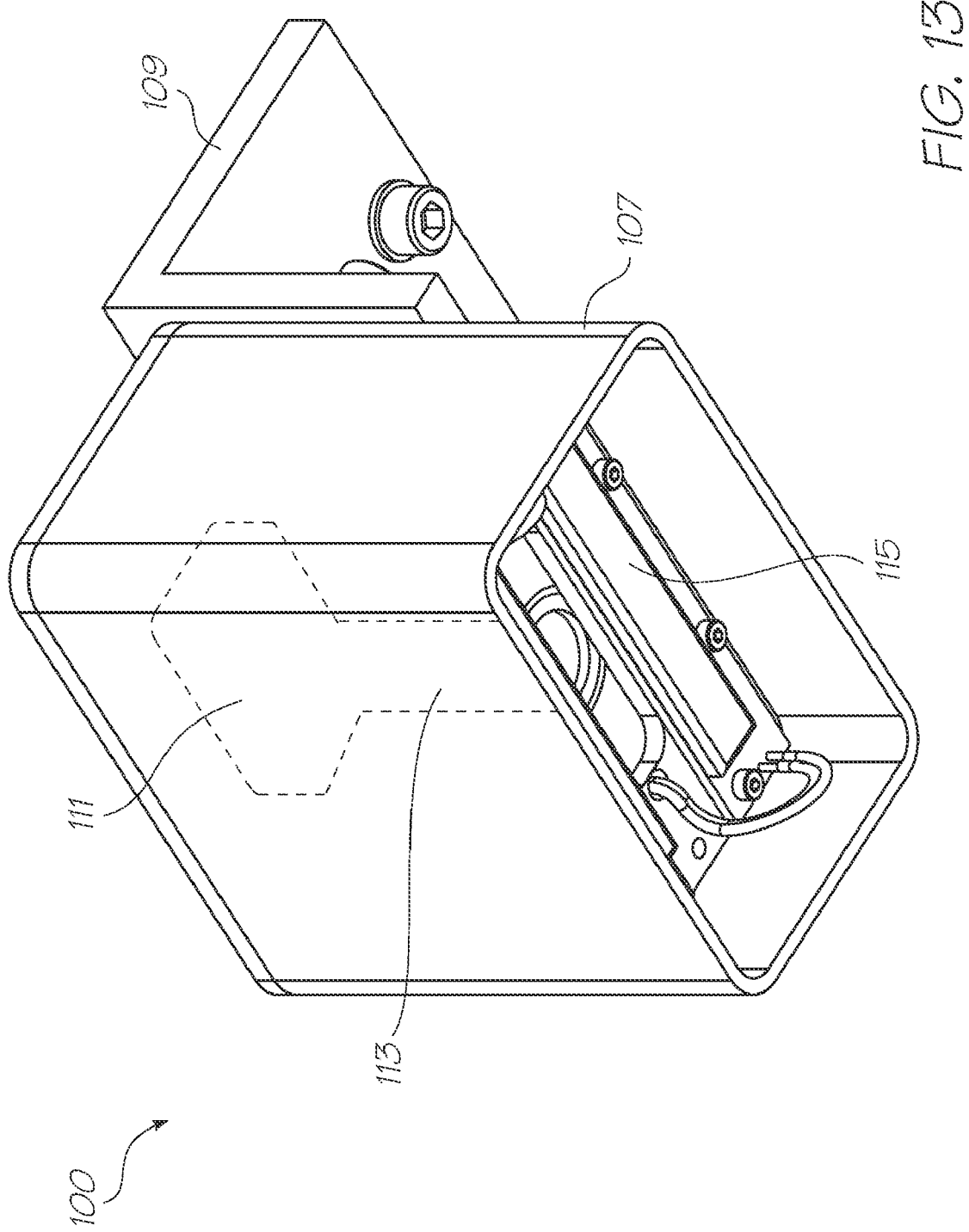
FIG. 13 shows a perspective view of a wafer scribe reader of the die picking assembly of FIG. 4.

More detail of the wafer scribe reader 100 can be seen in FIG. 13. The reader 100 includes a housing 107 mounted to the gantry 80 with a bracket 109. The housing 107 is configured to support a camera 111 with a video lens 113. The camera 111 is connected to the PC 34 so that the PC 34 can generate the image of the wafer identity number. The housing 107 also includes a light source 115 to illuminate the wafer 6 to read the wafer's identity number, in use.

Shuttle Transfer Apparatus/Die Conveyance Mechanism 20

Figure 14:
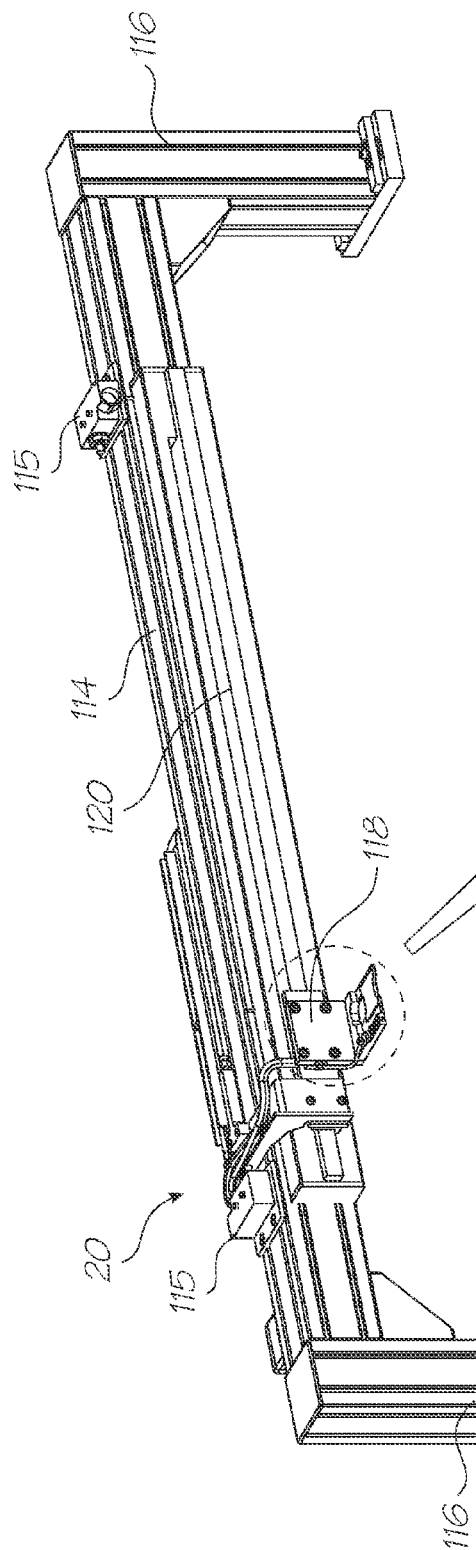
FIG. 14 shows a perspective view of a transfer apparatus, in accordance with one embodiment of the invention, in the form of a dice conveyance assembly of the assembler of FIG. 3.
Figure 15:
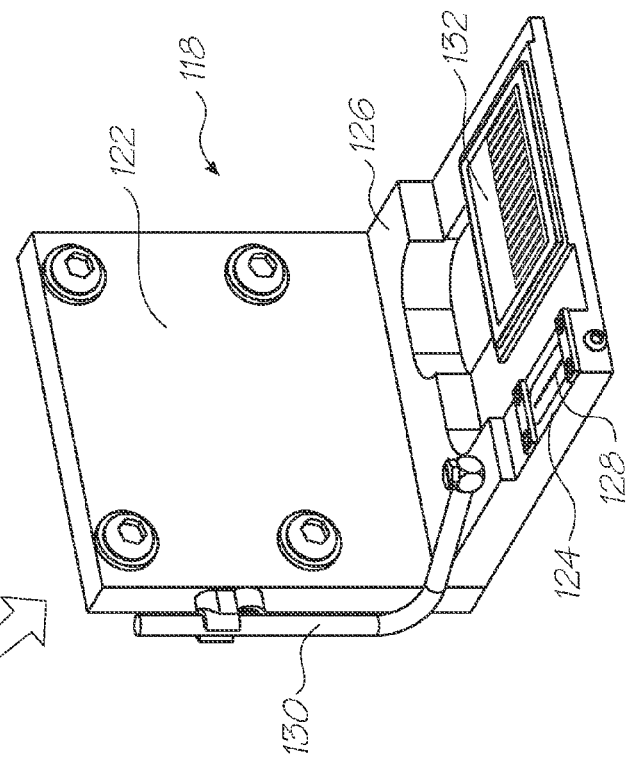
FIG. 15 shows a closer view of a component carrier or shuttle of the dice conveyance assembly of FIG. 14.

The shuttle transfer apparatus or die conveyance mechanism 20, in accordance with an embodiment of the invention, is shown in FIGS. 14 and 15. The shuttle transfer assembly 20 is configured to receive dice from the pick and lift head 78 and transfer them to the die placement assembly 22, described separately below.

The shuttle transfer apparatus includes a gantry beam 114. The gantry beam 114 also includes a pair of gantry posts 116 mounted on the optical table 26. A shuttle or carriage 118 is mounted on the beam 114 and is movable along the beam 114. A linear motor 120 is mounted on the beam 114 to drive the shuttle 118 to and fro along the beam. The linear motor 120 is maunder control of the PLC 38, described below, via a suitable controller.

FIG. 15 shows the shuttle or carriage 118 in more detail. The shuttle 118 includes a carriage plate 122 fast with a die plate 126. A vacuum plate 124 is fast with the die plate 126 and extends orthogonally from the carriage plate 122. The vacuum plate 124 defines a number of apertures 128 opening operatively upwardly. A vacuum tube 130 is mounted on the shuttle 118 and is connected to an operatively lower portion of the vacuum plate 124 and a vacuum pump (not shown) to generate a suitable vacuum when a die is positioned on the vacuum plate 124.

A gel pack 132 is also positioned on the die plate 126. The gel pack 132 serves to provide a deposition zone where the pick head 78 is programmed to deposit further dice for sampling purposes. Once deposited, the gel pack 132 can simply be removed from the die plate 126.

The gantry beam 114 is positioned on the support assembly 26 so that the shuttle 118 can be moved from a position in which the vacuum plate 124 can receive a die from the pick head 78, once the die has been lifted from the wafer. The gantry beam 114 is positioned so that the shuttle 118 can be moved to a position in which the die can be lifted from the vacuum plate 124 by the die placement assembly 22 described below.

Die Placement Assembly 22

The die placement assembly 22 (FIG. 16) is configured to receive the die from the shuttle 118 and place and bond it in a desired position on the liquid crystal polymer (LCP) carrier or sub-assembly 10 which is clamped in clamp assembly 146, described below.

The die placement assembly 22 includes a frame 138 mounted on support platform or the optical table 26 of the assembler 16. In one embodiment of the invention, the frame 138 is of granite. The frame 138 has a bed portion 140 and an upright portion 134, as shown. A spacer 136 is positioned on the bed portion 140. A cross roller assembly 142 is mounted on the spacer 136. The roller assembly 142 is configured to roll between a loading position (shown in FIG. 16), where the carrier 10 is loaded, and a placing position (shown in FIG. 17) where dice are placed onto the carrier 10. A clamp plate 144 is mounted on the cross roller assembly 142 to be displaceable along an X-axis as indicated by the axes shown in FIG. 16. The carrier clamp or clamp assembly 146 (described below) is mounted on the clamp plate 144 to clamp the LCP carrier 10 in position for the bonding of the dice.

The die placement assembly 22 includes a carrier loading door 32 arranged on the bed portion 140 and mounted to the housing frame 24 of the assembler 16 (FIG. 3) via bracket 121 to allow the carrier 10 to be loaded into the clamp 146. A placement head assembly 160 is mounted on a mounting plate 162, as shown. The mounting plate 162 is fast with the upright portion 134. The placement head assembly 160 is configured to lift the die from the shuttle 118 and to position it on the carrier 10. The die placement assembly 22 also includes an air heater assembly 164 (described below) to facilitate bonding of the dies to the carrier 10, which is held in the clamp 146.

The placement head assembly 160 includes a placement head 168 along with placement cameras and related optics 166.

Placement Head 168

Figure 18:
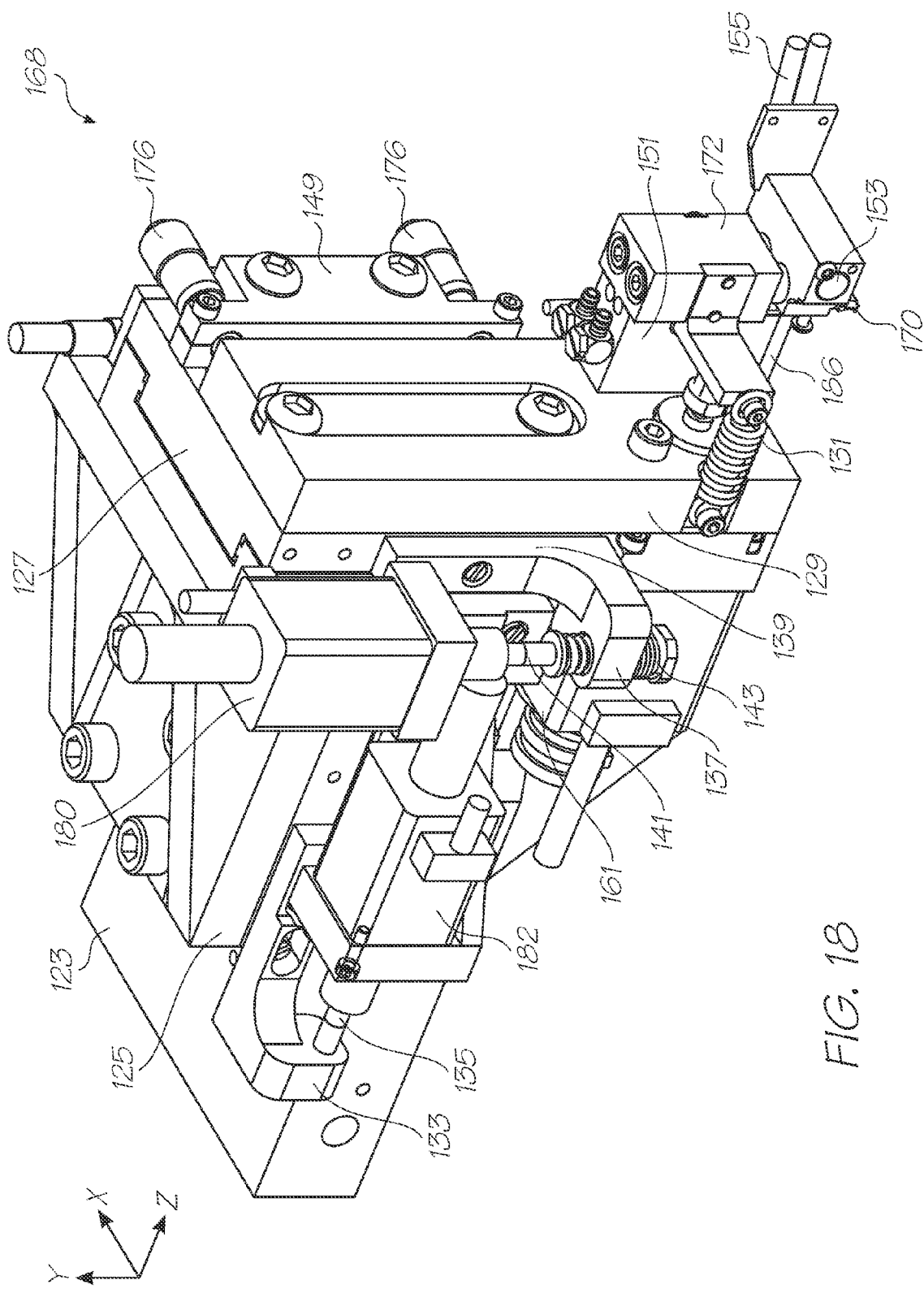
FIG. 18 shows a perspective view of a dice placement head, in accordance with one embodiment of the invention, of the dice placement assembly of FIG. 16.
Figure 19:
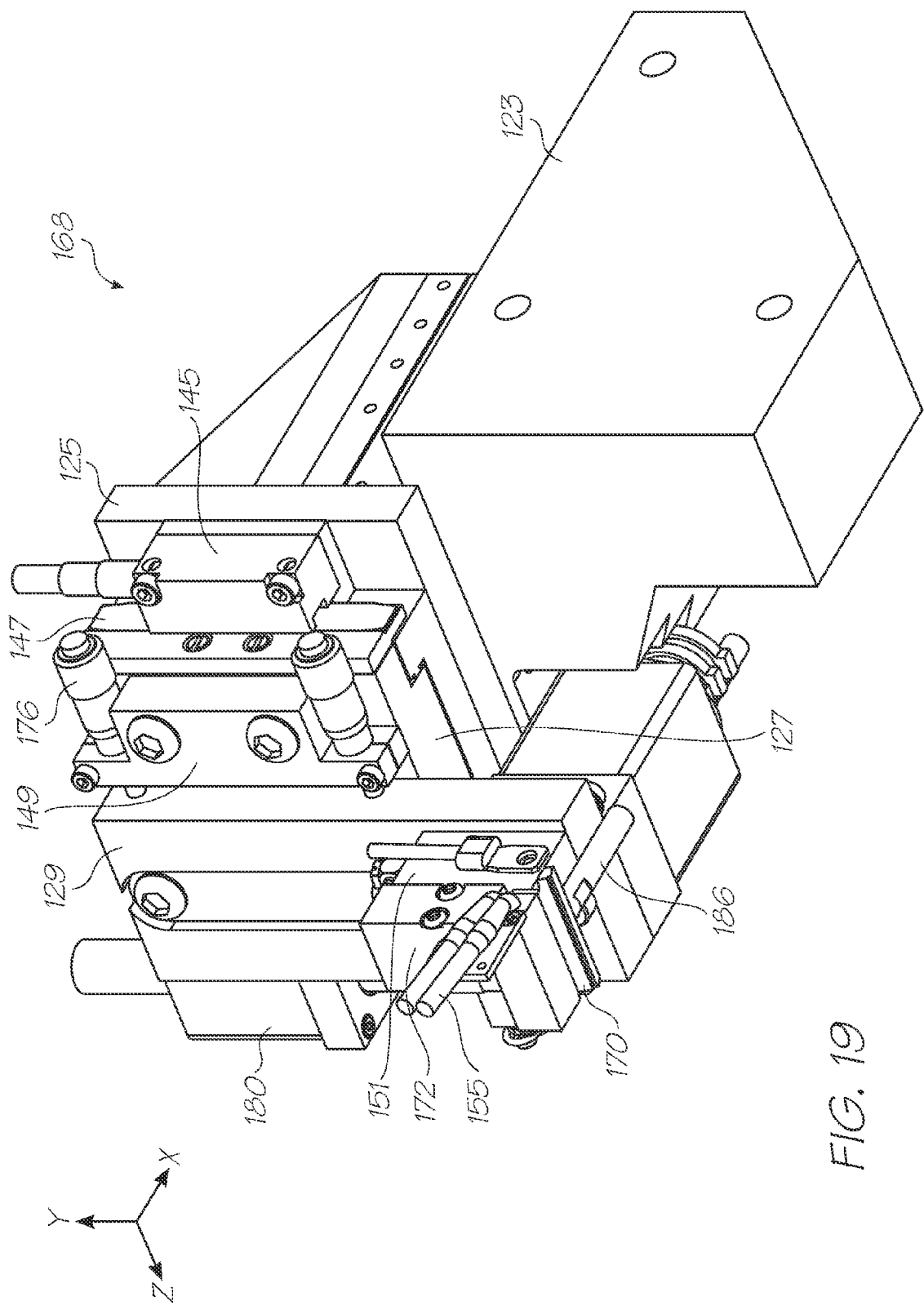
FIG. 19 shows a further perspective view of a dice placement head of the dice placement assembly of FIG. 16.

FIGS. 18 and 19 show a closer view of the placement head 168. The placement head 168 includes a placement head mounting block assembly 123. The placement head mounting block assembly 123 is fast with the upright portion 134 of the frame 138 through the mounting plate 162.

A Z-axis stage 125 is mounted on the block assembly 123 to be constrained for displacement along a Z-axis. For that purpose, a Z-axis stepper motor 182 is fast with the block assembly 123 via a bracket assembly 133. The Z-axis stepper motor 182 has a pushrod 135 that operatively engages the Z-axis stage 125 to push the Z-axis stage 125 along the Z-axis with respect to the block assembly 123. The Z-axis stepper motor 182 is operated under control of the PLC 38 via a suitable controller.

A Y-axis stage 127 is mounted on the Z-axis stage 125 to be constrained for displacement along a Y-axis (i.e. operatively vertically). For that purpose, a Y-axis stepper motor 180 is fast with the Z-axis stage 125 via a bracket assembly 137. A push bracket 139 is fast with the Y-axis stage 127 and engages a pushrod 141 of the Y-axis stepper motor 180 via a compression spring 143. A linear encoder 145 is mounted on the Z-axis stage 125, as shown. Scale tape 147 is fast with the Y-axis stage 127 to be read by the linear encoder 145 which is connected to the PLC 38 to provide positional feedback along the Y-axis.

In turn, an X-axis stage 129 is mounted on the Y-axis stage 127 to be constrained for displacement along an X-axis. For that purpose, an adjustment block 149 is fast with the Y-axis stage 127. A pair of X-axis micrometer drives 176 is fast with the adjustment block 149 and engages the X-axis stage 129 to provide adjustment of the X-axis stage 129 with respect to the Y-axis stage 127 along the X-axis. The micrometer drives 176 are connected to the PLC 38, via suitable controllers for control of the extent of adjustment of the X-axis stage 129.

A connector block 151 is fast with the X-axis stage 129. In turn, a flexible fixture 172 which can be a T-flex fixture is connected to the connector block 151. The fixture 172 defines a recess to accommodate a die placer head 170 so that the die placer head 170 extends partially from the fixture 172. The partial extension of the die placer head 170 from the fixture 172 is such that part of the head 170 can be received between the retaining plates 150 of the clamp 146, described below.

The die placer head 170 is ceramic and defines an aperture 153 in fluid communication with a vacuum tube 186 connected to a vacuum pump under control of the PLC 38. The die placer head 170 is shaped and dimensioned to receive a die from the wafer 6 operatively held on the vacuum plate 76. At that time, the PLC 38, via suitable controllers, operates to remove the vacuum applied at the vacuum plate 76 and to apply a vacuum at the placer head 170 via the tube 186 so that the dice is held in position by the head 170.

Figure 20:
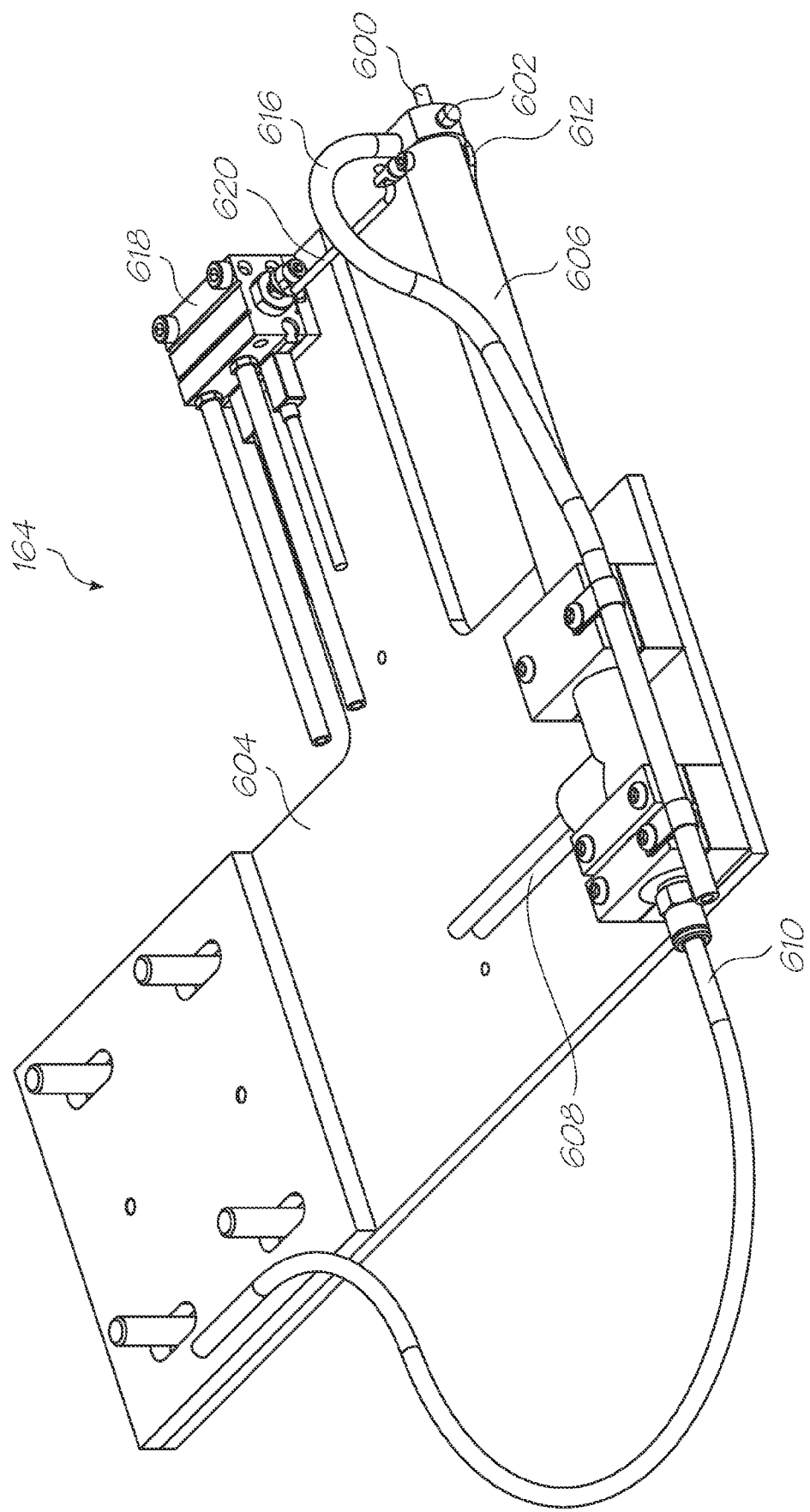
FIG. 20 shows an air heater assembly, in accordance with one embodiment of the invention, of the dice placement assembly of FIG. 16.

Air heater tubes 155 are connected to a hot air supply nozzle 600 of a heater valve assembly 602 of the air heater assembly 164 (FIG. 20). The air heater tubes 155 are connected to the die placer head 170 to heat the die placer head 170 such that the die can be bonded to the lamination film 12 on the carrier 10.

An angular motor 161 is also mounted through the X-axis stage 129 and is fast with the connector block 151. Actuation of the angular motor 161 by the PLC 38, via a suitable controller, causes angular pivoting of the dice placer 170 about the Y-axis. Also provided is angular movement spring 131 fast with the X-axis stage 129, as shown, to bias the angular movement of the placer 170 against the urging of the motor 161 to ensure smooth operation thereof.

Thus, the PLC 38 can be programmed so that when the insert 152 of the clamp 146 is correctly positioned in the clamp 146, the head 170 can be positioned to bear against the lamination film 12 and heated to bond the dice to the lamination film 12.

Air Heater Assembly 164

Figure 16:
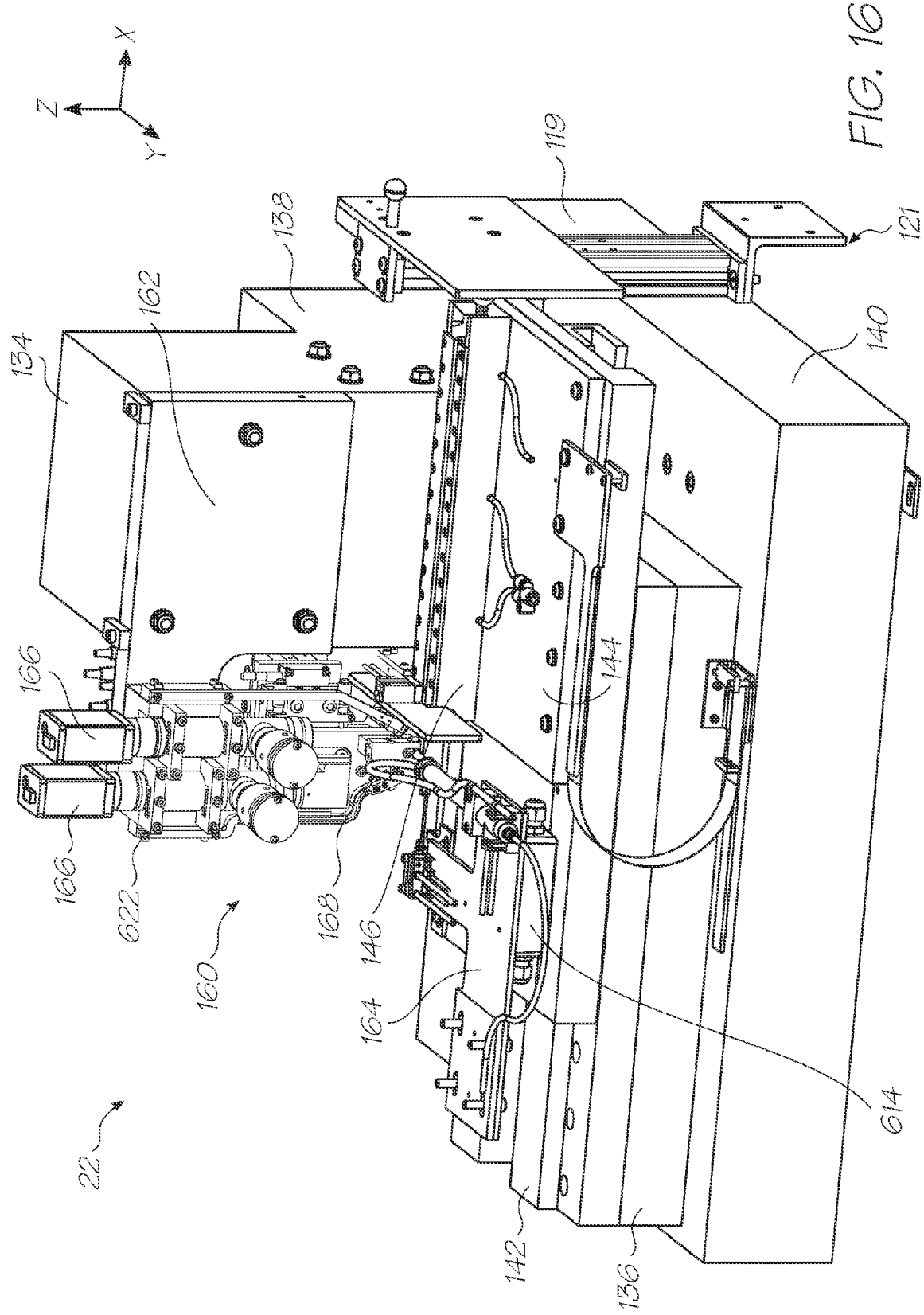
FIG. 16 shows a dice placement assembly, in accordance with one embodiment of the invention, of the dice assembler of FIG. 3, the placement assembly in a carrier loading position.
Figure 17:
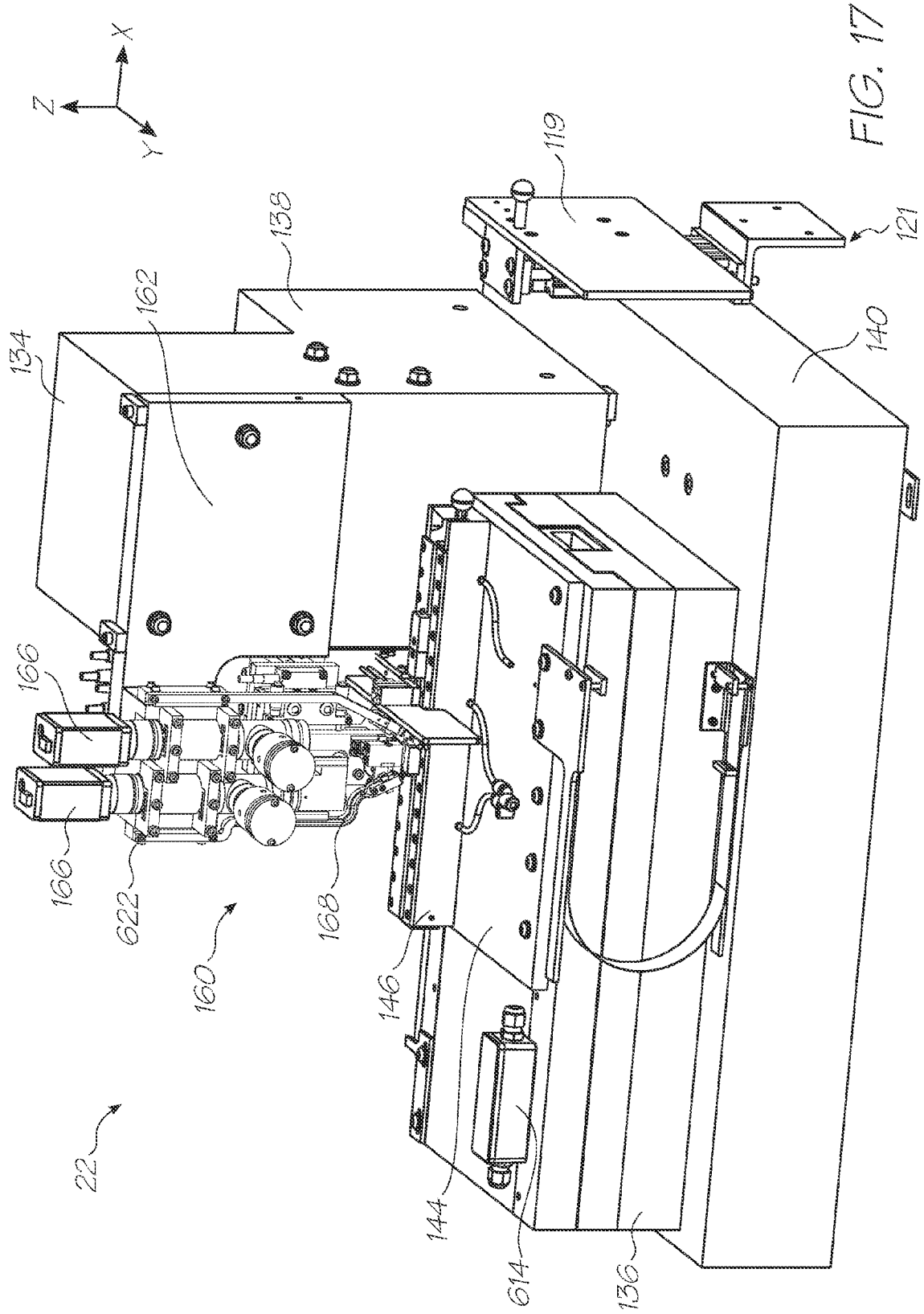
FIG. 17 shows the dice placement assembly of FIG. 16 in a dice placing position.

The air heater assembly 164 is mounted on the cross roller assembly 142 to direct heated air onto the carrier 10 held in the clamp 146. This serves to facilitate bonding of the die to the thermoset lamina film 12 on the carrier 10. The air heater assembly 164 is shown in more detail in FIG. 20. The air heater assembly 164 includes a heater mount plate 604 (FIG. 20). An air process heater 606 is mounted on the mount plate 604. The air process heater 606 receives an electrical power supply at 608 from an electrical box 614 (FIG. 16). The air process heater 606 is elongate with a cold air supply 610 at one end, as shown.

The heater valve assembly 602 is mounted on the air process heater 606 at an opposite end from the cold air supply 610. A thermocouple 612 is positioned in the heater valve assembly 602 to provide the PLC 38 with a signal to facilitate control of the heater valve assembly 602 via the electrical box 614 (FIG. 16). A hot air supply nozzle 600 and a hot air divert tube 616 are connected to the heater valve assembly 602.

A pneumatic actuator 618 is mounted on the heater mount plate 604 to control operation of the heater valve assembly 602 via a connecting rod 620. The pneumatic actuator 618 is operatively connected to the PLC 38 via a suitable controller, as described below, to control the egress of hot air from the heater valve assembly 602.

Placement Camera and Optics Assemblies 166

The placement camera and optics assemblies 166 enable the PC 34 to position the head 170 correctly over the carrier 10 prior to placing the dice.

The camera and optics assemblies 166 are mounted on a camera and optics assembly bracket 622 (FIG. 16) which, in turn, is fast with the mounting plate 162 on the upright portion 134 of granite frame 138. The camera and optics assemblies 166 are similar to the wafer camera and optics 82 shown in FIG. 12 and described above. It follows that the same reference numerals are used when referring to the components of the assemblies 166.

Each camera 102 is connected to the touch panel PC 34 so that an image of part of the clamp 146 and the carrier 10 can be displayed to an operator. The touch panel PC 34 is programmed to communicate with the PLC 38 as soon as the PC 34 identifies the ink outlets 14 in the lamination film. Identification of the ink outlets 14 permits the PC 34 to control the PLC 38 such that the carrier fiducials 15 (FIG. 2) and ink outlets 14 serve as placement fiducials. Thus, the PC 34 is able to determine a correct placement for dies to be bonded to the lamination film 12 of the carrier 10, described above.

Each die 8 typically has fiducials at each end which can be imaged by the cameras 102. Since a pair of cameras 102 is used to "see" the fiducials, the PC 34 is able to determine co-ordinates of the fiducials of respective dice relative to each other. This allows adjustment of the head 170 to ensure that respective dice are placed on the carrier 10 in alignment with each other.

Clamp Assembly

Figure 21:
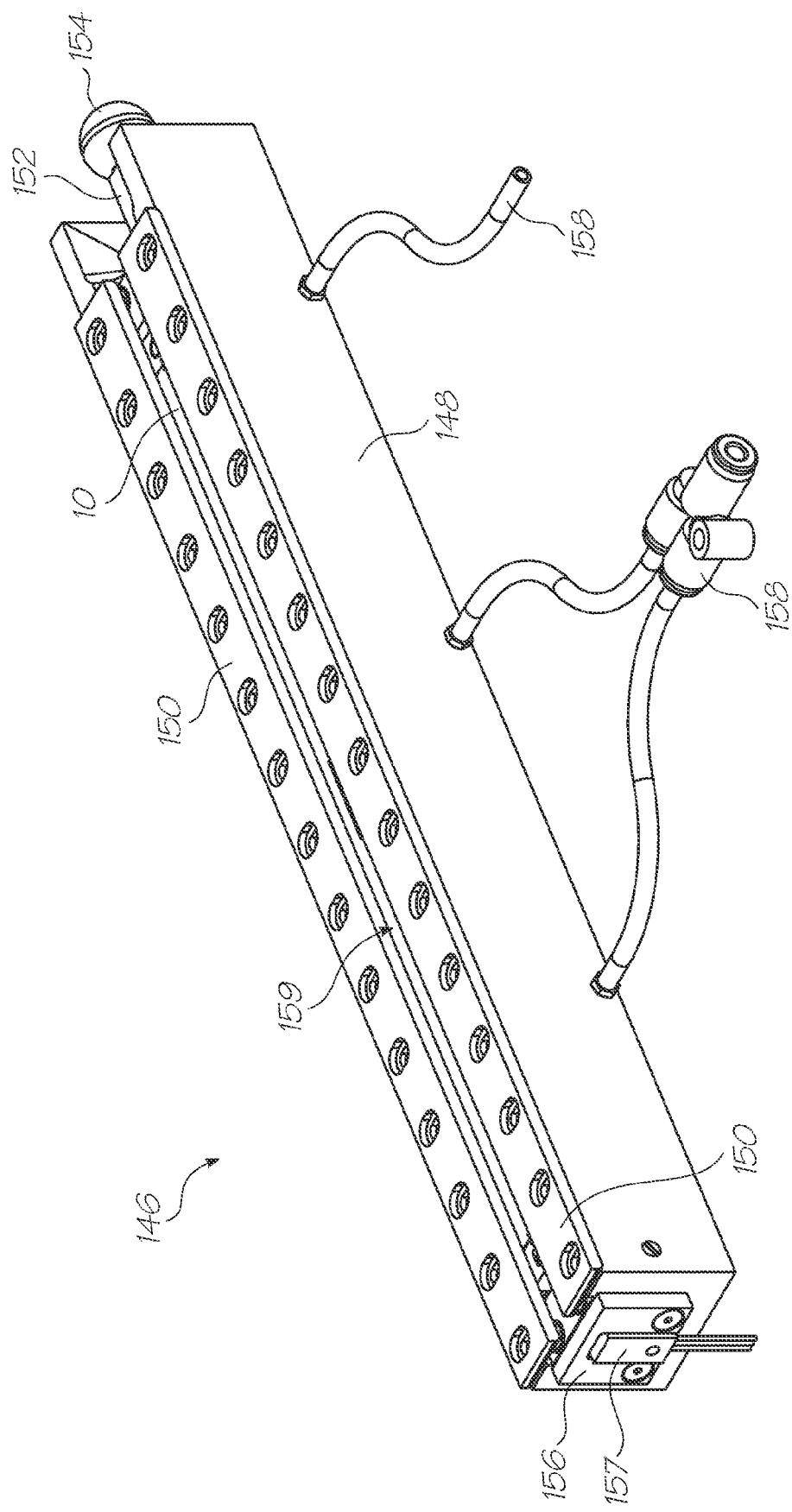
FIG. 21 shows a perspective view of a clamp mechanism used to position the test bed or carrier of FIG. 2 in the assembler.
Figure 22:
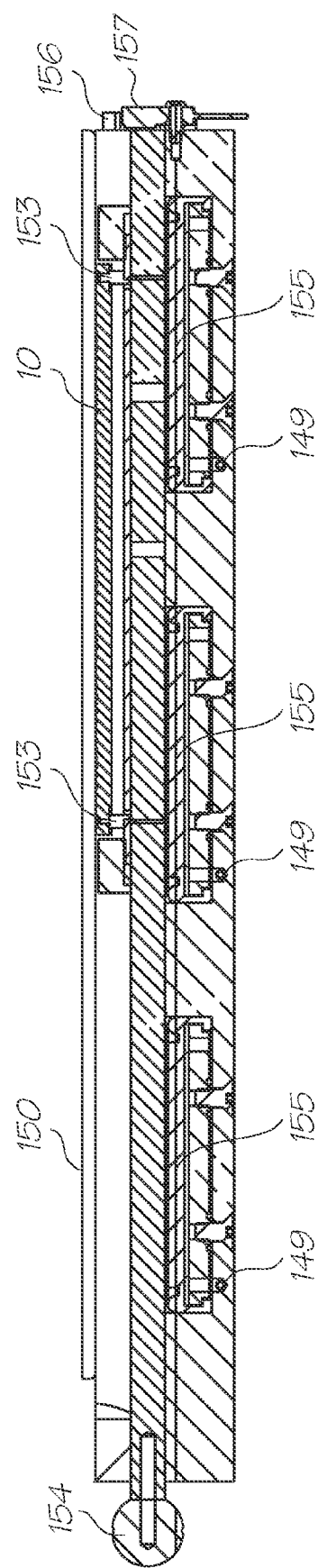
FIG. 22 shows a side sectional view of the clamp mechanism of FIG. 21.

The clamp assembly 146 is shown in more detail in FIGS. 21 and 22. The substrate clamp 146 is pneumatically operated. It includes an elongate clamp body 148 in which the carrier 10 is received. In particular, an insert 152 can be received in the clamp body 148. The carrier 10 is mounted on the insert 152 with location dowels 157 to ensure that the insert 152 is correctly positioned.

The clamp assembly 146 includes an insert stop 156 at one end of the body 148. A proximity switch 159 is mounted on the stop 156 to generate a signal, receivable by the PLC 38, when the insert 152 reaches the stop 156.

The clamp assembly 146 includes a pair of elongate retaining plates 150 mounted on the body 148 and defining an access gap 624 of sufficient width to permit positioning of the printhead integrated circuits 8 on the lamination film 12 of the carrier 10.

A diaphragm 625 is positioned in the body 148 and is displaceable towards and away from the retaining plates 150 with air supplied via air conduits 626. The diaphragm 625 and insert 152 are configured so that, when the insert 152 is received in the body 148, the diaphragm 625 can be activated to urge the carrier 10 against the retaining plates 150 with the gap 624 providing the necessary space for the placement of the integrated circuits. Thus, under control of the PLC 38, when the insert 152 is inserted into the body 148, an air supply can be provided, via a pneumatic fitting 158 to the diaphragm 155 to urge the carrier 10 against the pneumatic plates 150 so that the carrier 10 is retained in position during placement of the integrated circuits 8. A handle or knob 154 is fast with the insert 152 to facilitate manipulation of the carrier 10 into position between the clamp plates 150 prior to clamping of the carrier 10.

Processes

Generally, the process carried out by the assembler 16 can be summarized as follows:

The carrier 10, mounted on the insert 152, is scanned for a serial number and then loaded into the clamp 146, as described above, such that an attachment surface defined by the lamination film 12 is substantially flat.

The carrier 10 is moved, together with the carrier 10 to where the camera and optics assemblies 166 are, together with the PC 34, used to locate fiducials on the carrier surface to provide a reference for a first die 8 to be placed on the carrier surface.

A wafer 6 is scanned and loaded onto the vacuum and heater plate assembly 76. The assembler 16 makes use of an input instruction file or wafer map associated with the wafer 6 to determine the actual dice, and their positions, to be attached to the lamination film 12 on the carrier 10.

Once the die 8 is released from the wafer 6, it is transferred to a die placement location, aligned and attached to the lamination film. How this is done is described above with reference to the relevant components.

Once the die 8 is aligned, it is lowered into contact with the lamination film 12 and a set pressure is applied.

Once in contact with the lamination film 12, the die 8 is heated for a predetermined duration to attach the die 8 to the lamination film, which is typically a thermoset film.

These steps are performed by various components controlled by the PLC 38 under supervision of the PC 34 and with various controllers.

Figure 23:
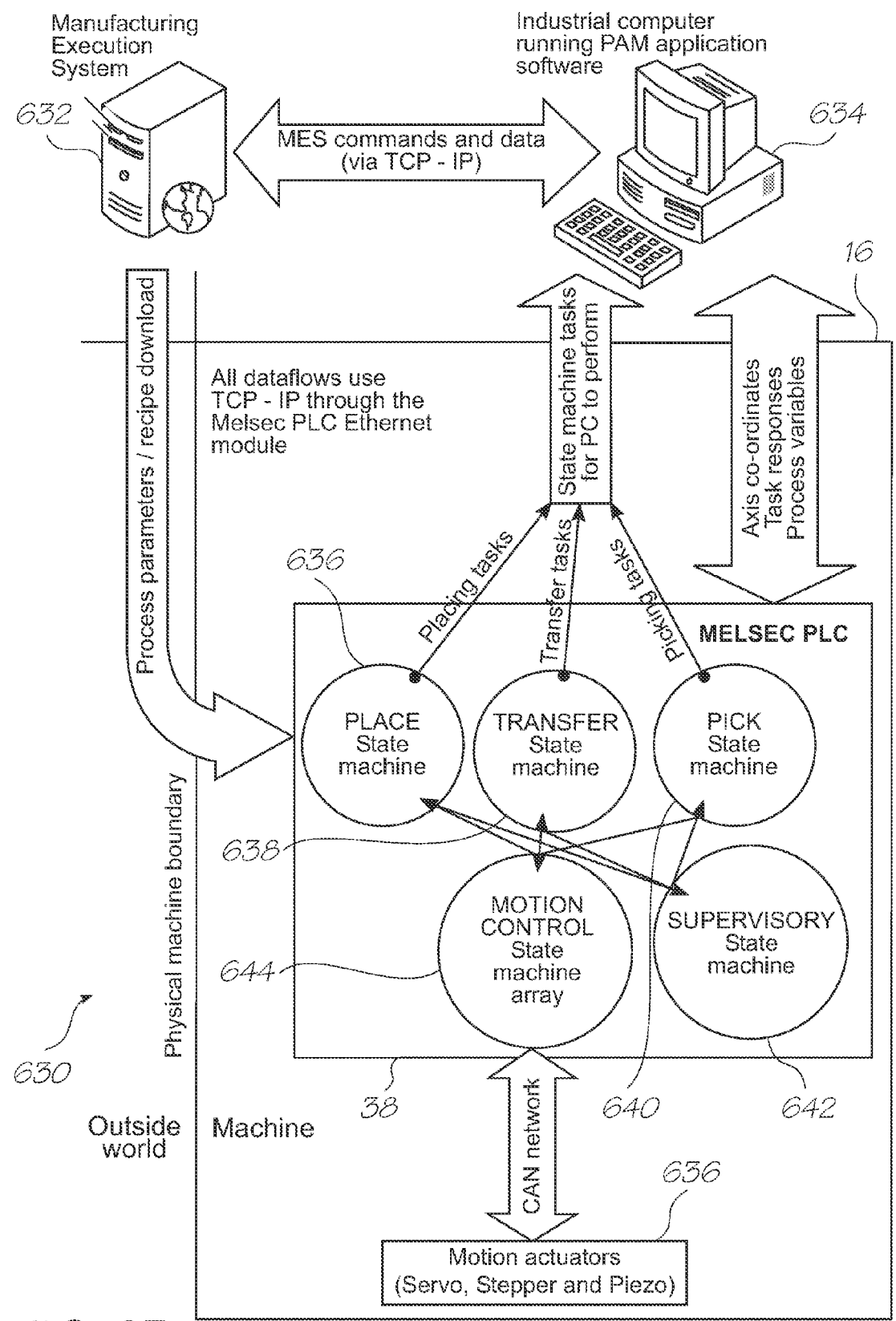
FIG. 23 shows a schematic diagram of high level data flow used to control the assembler of FIG. 3.

In order to describe how the various components, described above, carry out these steps, it is necessary to refer initially to a high level data flow diagram as shown in FIG. 23. The diagram shown in FIG. 23 shows a method or process and a system, in accordance with one embodiment of the invention, for controlling operation of the printhead assembly machine or assembler 16 for assembling printhead integrated circuits on a carrier.

In this embodiment, such a system is generally indicated by reference numeral 630. The system 630 includes a Manufacturing Execution System (MES) server 632 and an industrial computer 634 running printhead assembly machine (PAM) application software for the assembler 16. The MES server 632 and industrial computer 634 are collectively referred to as a remote monitoring system.

In this embodiment, the MES server 632 provides the PLC 38 of the assembler 16 with the wafer map and operating instructions, mentioned above. The industrial computer 634 (equivalent to the PC 34) receives data via an Ethernet module of the PLC 38. This data typically includes positions or axis coordinates of the respective actuators or drives described above, task responses, process variables, or the like. In addition, the PLC 38 also sends the industrial computer 634 state machine tasks to perform, as shown.

The data sent by the PLC 38 to the computer 634 can includes number of dice consumed from the wafer 6, placement order of the dice, the scanned identity number of each wafer, positions of die and carrier fiducials, start and stop cycle times, operator identity, carrier barcodes, status of parts used, etc.

The industrial computer 634 and the MES server 632 exchange instructions and data relating to the operation of the assembler 16, typically via TCP-IP. The MES server 632, in turn, supplies the PLC 38 with information regarding the wafer map indicating which dice on the loaded wafer is to be mounted on which carrier, process parameters, etc.

As indicated, the PLC 38 is configured, via suitable software instructions, to define a number of state machines necessary to control operation of the assembler 16. This PLC 38 defines a place state machine 636, controlling operation of the die placement assembly 22, a transfer state machine 638, controlling the shuttle transfer assembly 20, and a pick state machine 640 controlling the die picking assembly 18. The PLC 38 also defines a motion control state machine array 644 responsible for control of the relevant actuators and drives, described above with relation to the different components and collectively indicated at 637. A supervisory state machine 642 is also shown which is responsible for safety and supervision of the operation of the assembler 16.

Figure 24:
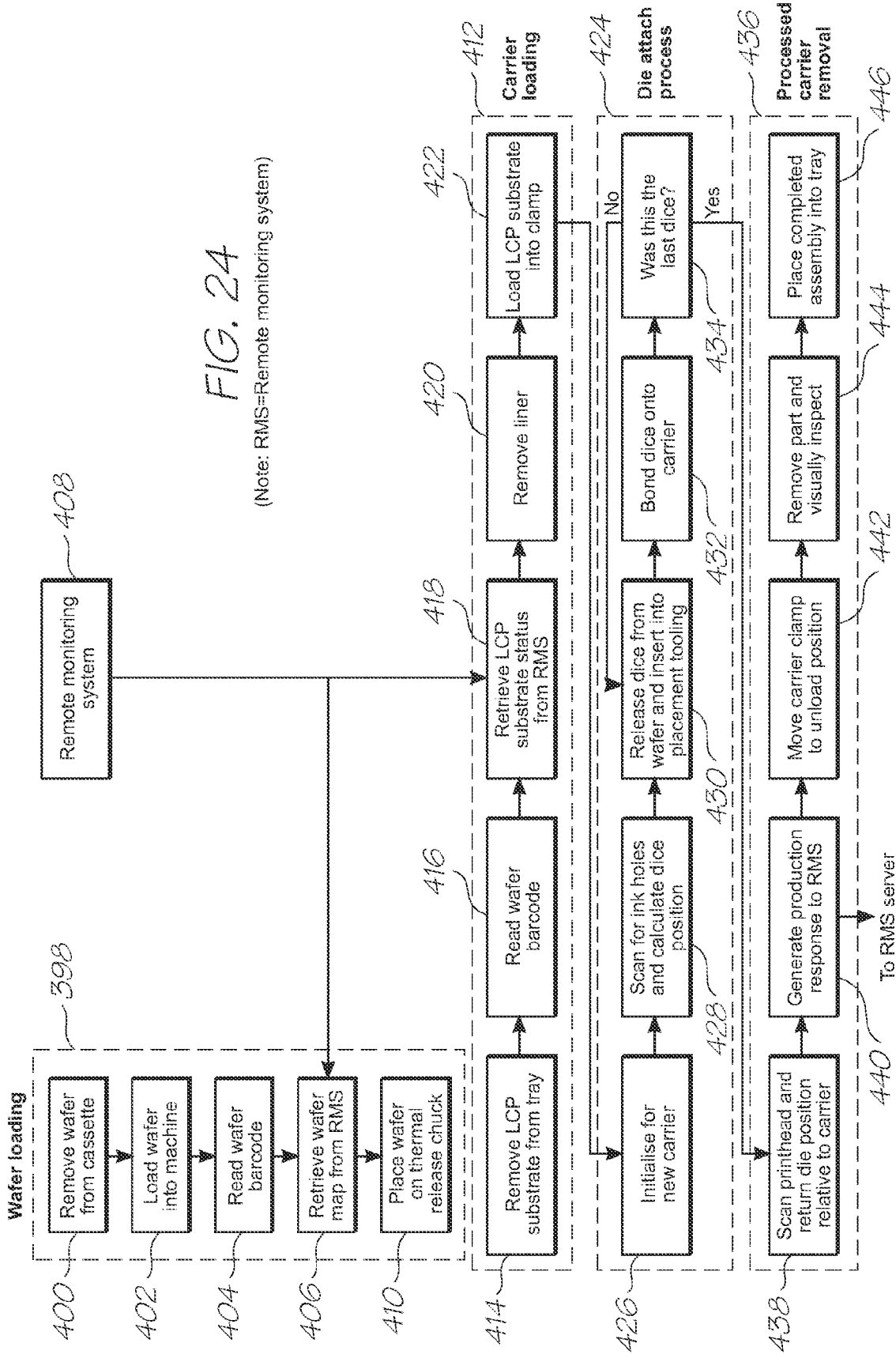
FIG. 24 shows a diagram of high level method steps of using the assembler of FIG. 3 to assemble printhead circuitry on the carrier of FIG. 2.

FIG. 24 shows a flow diagram of a global overview for a method or process, in accordance with one embodiment of the invention, performed by the various components, described above, under control of the PC 34, the PLC 38, an operator and/or the remote monitoring system or RMS (indicated at 408) in controlling the assembler 16. As mentioned above, the RMS 408 includes the MES 632 and the industrial computer 634. It is to be appreciated that some of the steps are performed automatically by the PC 34, PLC 38 and RMS 408, whilst others require input from an operator.

It is to be appreciated that reference to a reference numeral representing a particular method step refers to a respective block indicated by such reference numeral in the accompanying drawings. As such, the method included in the invention is not limited or constrained to particular method steps referred to in this manner. A skilled person will understand that further methods are possible under this invention which might exclude some of these steps or include additional steps.

General steps for the assembler 16 having the die picking assembly 18, the die conveyance mechanism 20 and the die placement assembly 20 are shown. The remote monitoring system 408 is arranged in signal communication with the PLC 38, as described above, and allows remote monitoring and control of an operational status of the assembler 16. The RMS 408 is also able to keep track of carriers and wafers, as well as which dies are placed on which carriers. The RMS plays an integral role in quality and assurance control for assembly of the carrier 10.

As shown, the process includes a wafer loading phase 398, a carrier loading phase 412, a die attach stage 424, and a processed carrier removal stage 436.

The wafer loading stage 398 features the steps of removing the wafer from a clean cassette wherein the wafers are stored (block 400), loading the wafer into the assembler 16 (block 402), and the PLC 38 reading the wafers barcode (block 404). In the embodiment shown, the wafer mapping scheme is retrieved by the PLC 38 from the remote monitoring system 408 (block 406), as described above. This wafer mapping scheme typically provides a location and picking order of the ICs on the wafer 6. The wafer 6 is then placed onto the wafer heating and vacuum plate 76.

The carrier loading phase 412 features the steps of removing the carrier 10 from a tray (block 414) whereafter the barcode of the carrier 10 is scanned by the PLC 38 and sent to the remote monitoring system 408. In the embodiment shown, the carrier 10 consists of a liquid crystal polymer (LCP) substrate, as indicated in some of the blocks. The remote monitoring system 408 checks whether or not the carrier has cleared quality control tests previously performed thereon, before the PLC is instructed to assemble the dies thereon. If the carrier has cleared such tests (block 418) and is of sufficient quality, the operator removes a protective liner (block 420) covering the lamina 14 and loads the carrier into the assembler 16 (block 422).

The die attach process 424 follows with the assembler initializing (block 426), and scanning the wafer to locate the dies according to the wafer substrate mapping scheme from the remote monitoring system 408 (block 428). The dies are then picked from the wafer (block 430) and transported to the placement assembly 22 where they are bonded to the carrier (block 432). The picking and placement steps are repeated until the carrier includes the required number of dies (block 434) specified by the wafer map.

The processed carrier removal stage 436 includes a scan of the completed carrier with ICs which define a printhead (block 438) and sending the quality report to the remote monitoring system at block 440. The carrier 10 is then moved to the unloading position (block 442) where the operator can remove it from the assembler 16 and inspect it visually at 444. The completed carrier 10 with printhead is then placed into a tray at block 446.

Figure 25:
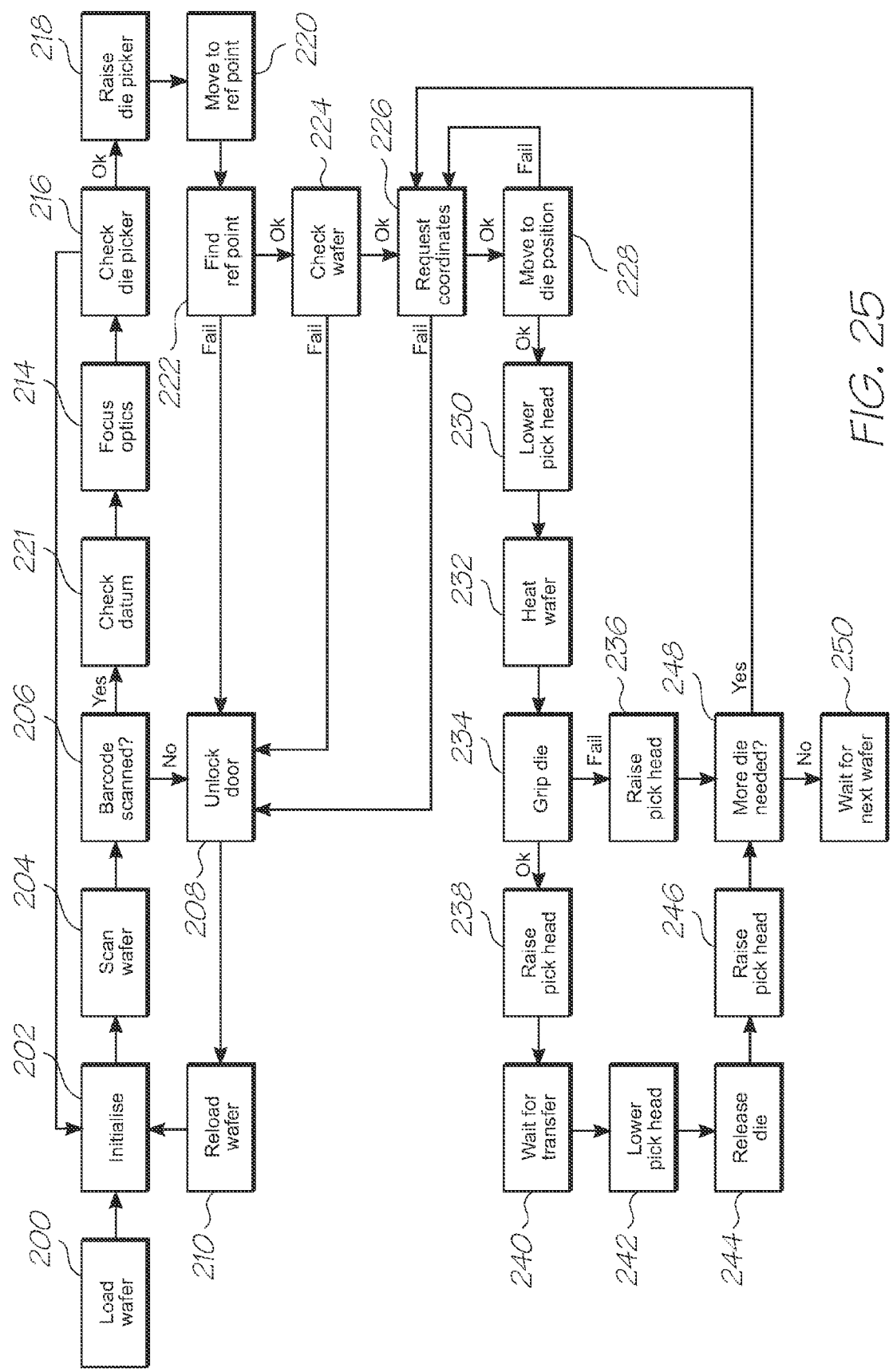
FIG. 25 shows a block diagram representing method steps for picking a die from a wafer.

FIG. 25 shows specific steps performed during operation of the die picking assembly 18 in picking the dies from the wafer 6. The method typically commences with an operator loading a wafer 6 into the assembler 16, indicated at block 200. The wafer 6 is positioned on the wafer positioning assembly 48, described above.

The assembler 16 initializes (block 202) and the scribe reader 100 is used, under control of the PLC 38, to scan the wafer barcode at block 204. The PLC 38 is configured so that an unsuccessful scan, decided at decision block 206, of the barcode causes the PLC 38 to unlock a wafer loading door (block 208) of the assembler 16 so that the operator can remove and/or reposition the wafer on the assembly 48 (block 210). The PC 34 is configured to control the wafer cameras and optics 82 to check for a starting point or datum marked on the wafer (block 212), which serves as reference point for the wafer substrate mapping scheme used by the PLC 38 to locate the respective dies on the wafer 6.

Once the camera and optics 82 have been focused at 214, the PLC 38 checks the die picker 81 for position of the stage 92 and the drives 98 along with the heater 90 (block 216). Should the die picker 81 fail the check, the assembler 16 re-initializes and might issue a warning to the operator. If the die picker 81 passes the check, it is raised (block 218) and moved to a reference point indicated by the mapping scheme (block 220). The PLC 38 uses the camera and optics 82 to find the reference point on the wafer 6 (block 222). If the PLC is unable to locate the reference point, the wafer loading door is unlocked allowing access to the wafer 6.

The optics 82 checks the wafer (block 224) and coordinates for a die to be picked is requested by the PLC from the mapping scheme (block 226). Failure of any of these two steps leads to unlocking of the wafer access door, as shown. If the coordinates are provided, the die picker 81 is moved to the correct position (block 228), else the coordinates are requested again. Once the die picker 81 is in position, the pick surface 86 is lowered (block 230) and contacted with the die and the wafer is heated with the heater 90 (block 232) to loosen an adhesive holding the die to the wafer 6. The die is then gripped by a vacuum established through the pick surface 86 (block 234), as described above, and the die picker is raised (block 238) to remove the die from the wafer 6.

The die picking assembly 18 then waits for the die conveyance mechanism 20 (block 240) to get into position, whereafter it lowers the die onto the shuttle 118 (block 242) and releases the die by removing the vacuum (block 244). The die picker is raised again (block 246) and the process is repeated, as shown, if additional dies must be picked from the wafer (decision block 248). If the mapping scheme does not require further dies to be picked, the die picker is returned to a waiting position for a new wafer to be loaded into the assembler 16 (block 250).

Figure 26:
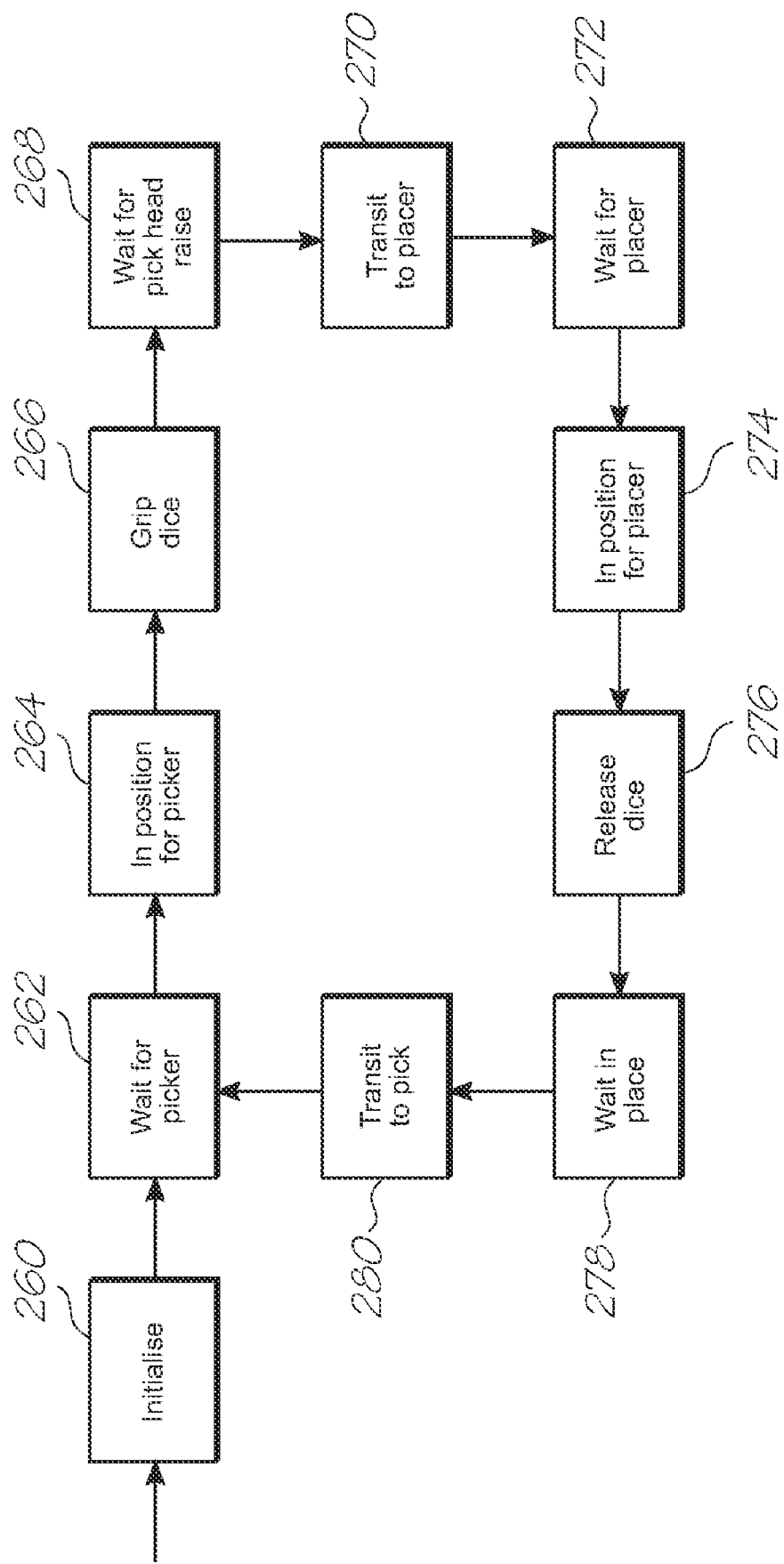
FIG. 26 shows a block diagram representing method steps for transferring a dice between the die picking assembly and the die placement assembly.

FIG. 26 shows one embodiment of a method performed by the die conveyance mechanism 20. Similar to the die picking assembly above, the process commences with initialization of the mechanism 20 (block 260). The shuttle 118 waits for the die picker 81 (block 262) until the picker moves into position over the shuttle 118 (block 264). Once the die picker 81 is in position, the vacuum plate 124 on the shuttle 118 receives the dice and grips the dice by establishing a vacuum (block 266). The shuttle 118 waits for the pick head to raise (block 268) whereafter it transfers along the gantry beam 114 to the die placement assembly 22 (block 270).

The placement head assembly 160 includes the dice placer 170. The shuttle 118 waits for the placer 170 to move into position (blocks 272 and 274), whereafter the vacuum plate releases the gripped dice (block 276) and remains in place (block 278) so that the picker 170 can pick it up. When the picker 170 has removed the dice, the shuttle moves back to the die picking assembly 18 to repeat the process (block 280).

Figure 27:
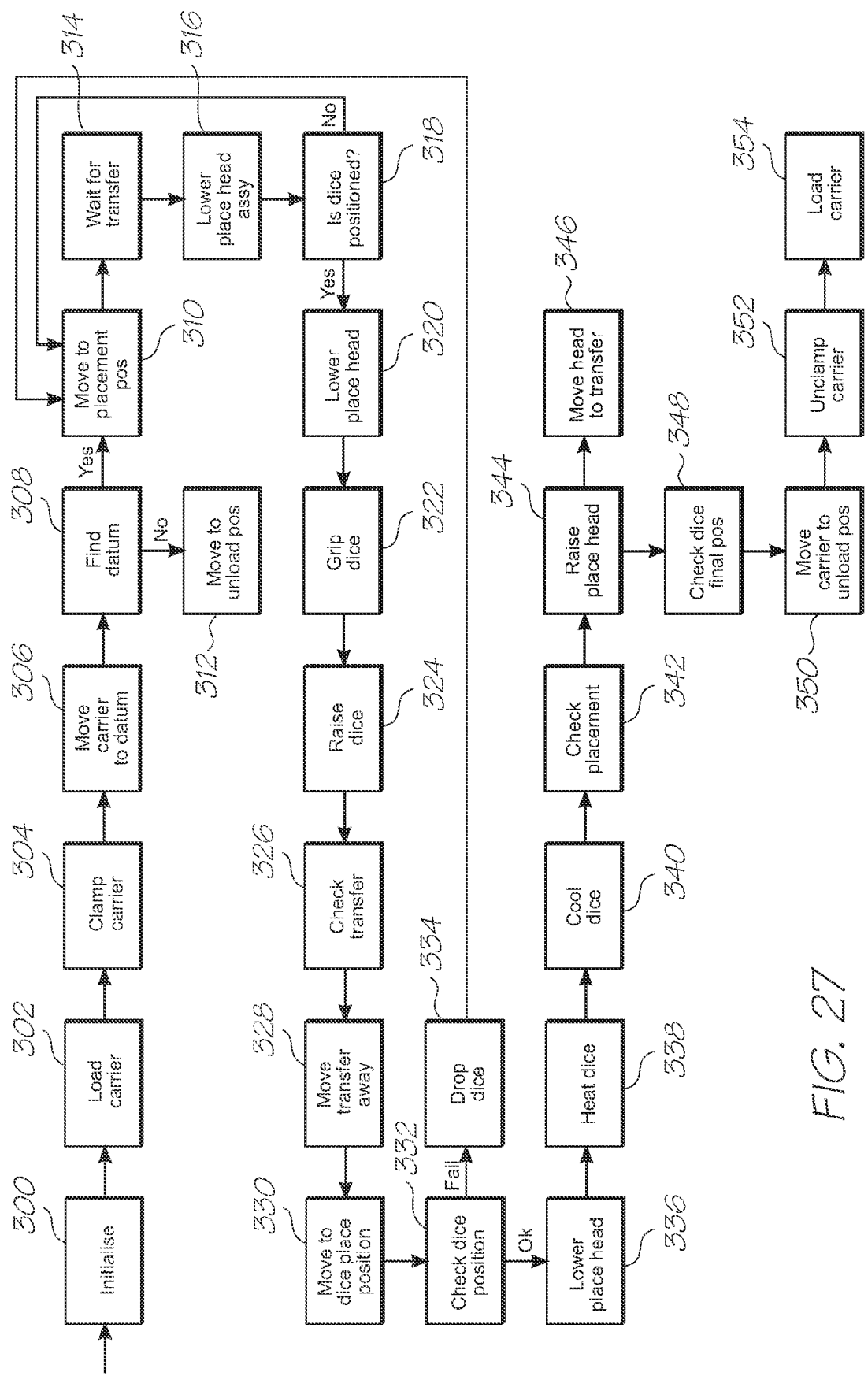
FIG. 27 shows a block diagram representing method steps for placing a dice onto the carrier of FIG. 2.

FIG. 27 generally shows one embodiment of method steps for the tasks performed by the die placement assembly 22. The process also starts with the assembly 22 initializing (block 300) whereafter the carrier 10 is loaded into the clamp 146 (block 302) via the carrier loading door 119 and clamped (block 304) in clamp 146. The carrier 10 is then moved into a reference position by the cross roller stage 142 at block 306. The placement cameras and optics 166 scans the carrier 10 for the fiducial indicators 15 for aligning the dies thereon. If the fiducials are not found (decision block 308), the stage 142 moves the carrier 10 to an unload position (block 312).

If the fiducials are found, the stage 142 moves the carrier 10 into a placement position (block 310) where the placement assembly 160 can place the dies onto the carrier 10. The placement head 168 waits for the shuttle 118 to deliver the die picked from the wafer, described above (block 314). Once the shuttle is in place, the placement head 168 is lowered (block 316). If the dice is correctly positioned (decision block 318), the dice placer 170 is lowered (block 320) to grip the dice (block 322). Otherwise, the placement assembly 160 is moved back to the placement position.

Once the dice has been gripped, the dice placer 170 is raised (block 324) and the transfer shuttle 118 is checked for clean pick-up (block 326) and moved away back to the die picking assembly 18 (block 328). The dice placer is moved to a place position over the carrier 10 (block 330) and the PC 34, via the camera and optics 160, aligns the gripped dice with the carrier (block 332). The die placer head 170 is lowered at 336. The die placer head 170 then places the dice onto the carrier 10 through gap 159 of clamp 146. The air heater assembly 164 the dice and carrier to secure the dice to the thermoset lamina 14 (block 338), whereafter the dice is allowed to cool (block 340).

The placement camera and optics 166 then allow the PC 34 to check the placement of the dice on the carrier (block 342), before the placement head 168 is raised (block 344) and moved for the next dice placement (block 346).

Once the head 168 is moved out of the way (block 346), the PLC 38 can check the final position of the dice (block 348) and move the carrier 10 to an unloading position (block 350), where the operator can unclamp the carrier (block 352) and remove it from the housing 24 of the assembler 16, prior to loading a further carrier (block 354).

Operator Interface

Figure 28:
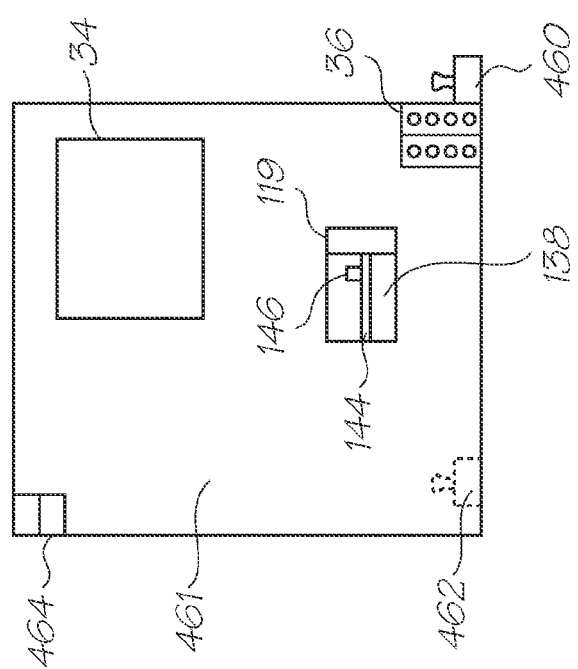
FIG. 28 shows an embodiment of an operator interface for the assembler of FIG. 3.

FIG. 28 shows, schematically, a left-hand portion of the assembler 16 of FIG. 3, showing the operator interface in more detail. The interface includes the touch panel PC 34 and the control button console 36. Also shown is a warning beacon 464 (numeral 35 in FIG. 3) and emergency stop buttons 460 and 462. Button 460 is an operator emergency stop button, with button 462 being a maintenance emergency stop button. The carrier loading door 119 is positioned in the front panel 461 of the enclosure 24 of the assembler 16, as shown. The granite frame 138 of the die placement assembly 22 can be seen through the loading door 119, along with clamp plate 144 and clamp 146.

Electrical Components

Figure 29:
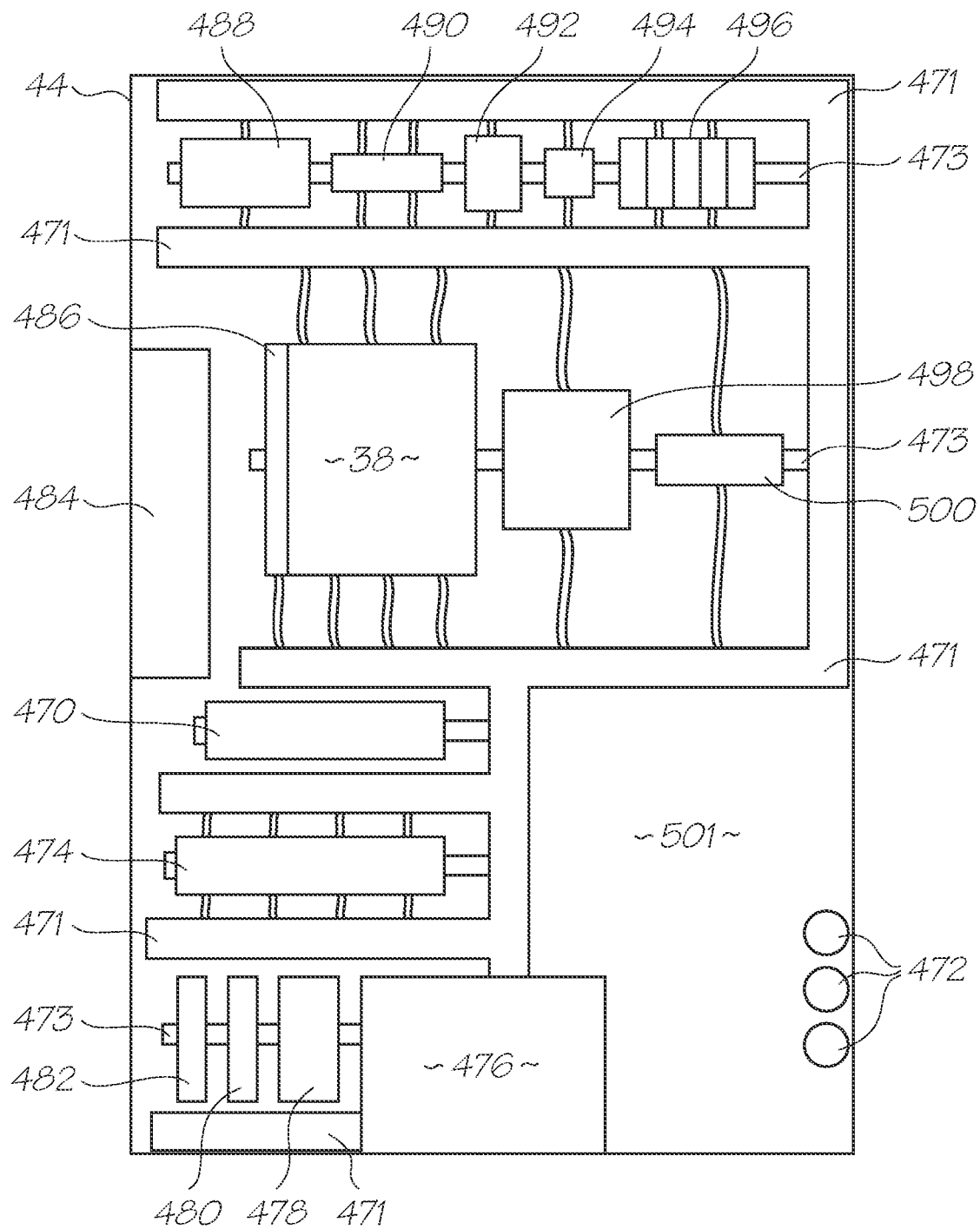
FIG. 29 shows an electrical enclosure of the assembler in an open position showing internal electrical components.

FIG. 29 shows the electrical enclosure 44 at the rear of the assembler 16 (FIG. 3) in an open position. The control system of the assembler includes the PLC 38, which is a Mitsubishi FX3U-64M PLC unit 645 having expansion blocks in the form of a FX2N-2LC temperature control block 646 (FIG. 33) in the form of modules, a FX3U-ENET Ethernet interface module 647, a FX0N-3A analog I/O special function block or module 648, and a FX2N-32CAN controller area network (CAN) serial bus interface module 649.

Figure 32:
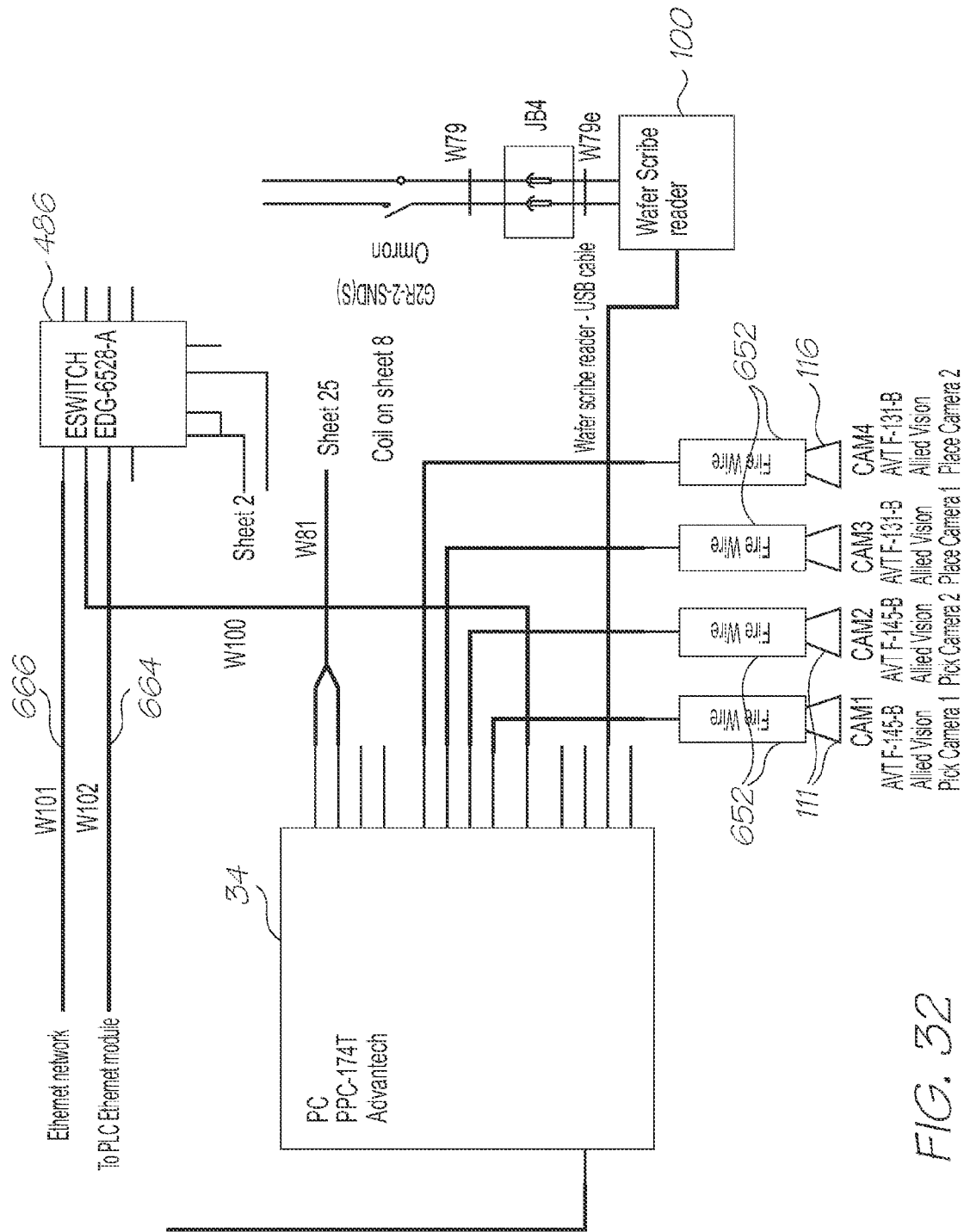
FIG. 32 shows a circuit diagram of a touch panel PC and optical components of the assembler.

The PLC 38 is connected to the PC 34 with an Ethernet switch 650 as shown in FIG. 32. The PLC 38 receives programmed instructions from the PC 34 such that the PLC 38 can control operation of the die picking assembly 18, the transfer mechanism 20 and the die placement assembly 22.

Lighting controllers 470 (FIG. 29) are included to control the LED adaptors 108 of the cameras and optics 82 and 166. The controllers 470 are Gardasoft PP610 lighting controllers. Also included are the vacuum pumps 472 for providing the various required vacuums for securing the wafer and dies in the relevant components of the assembly 16, as described above. The vacuum pumps 472 are Busch dry-running rotary vane type pumps.

It is to be appreciated that the respective components are connected via electrical and/or pneumatic connections housed in trunking 471. Rail 473 provides mounting locations for the different components housed in enclosure 44. As such, the physical connections between the components are diagrammatically indicated, as the skilled person will understand the required connections.

Motor axis controllers collectively indicated by numeral 474 are connected to the PLC 38 to facilitate control of the different motors and drives of the components of the assembler 16. A more detailed description of this motor control is provided below.

A Power supply 476 is configured for providing a 160 Volt DC supply to operate the vacuum pumps 472. Power supplies 496 are configured for providing 5, 9, 15 and 24 Volt power supplies to relays and motor contactors of the assembly.

Relays 478 and fuses 480 provides connection to and protection for the electrical components powered by power supply 476, with relays 492 and fuses 494 providing connection to and protection for components powered by supply 496.

Relays 482 provide a connection for the heater elements of the assembler 16. It is to be appreciated that the different relays allow the PLC 38 to activate and deactivate the respective components. Also shown is a 48 Volt power supply 484 and Ethernet switch 486 (shown as 650 in FIG. 32). Circuit breakers 488 provide overcurrent protection for the components. Motor contactors 490 are connected to the controllers 474 to allow the PLC 38 to control various motors of the assembler. Safety muting controller 498 and door switch controller 500 provide safety by deactivating the assembler if a door, such as carrier loading door 119, is opened whilst the assembler 16 is active. Pneumatic enclosure 501 forms part of the pneumatic enclosure 46 (FIG. 3) of the assembler 16.

Motor Control

Figure 31:
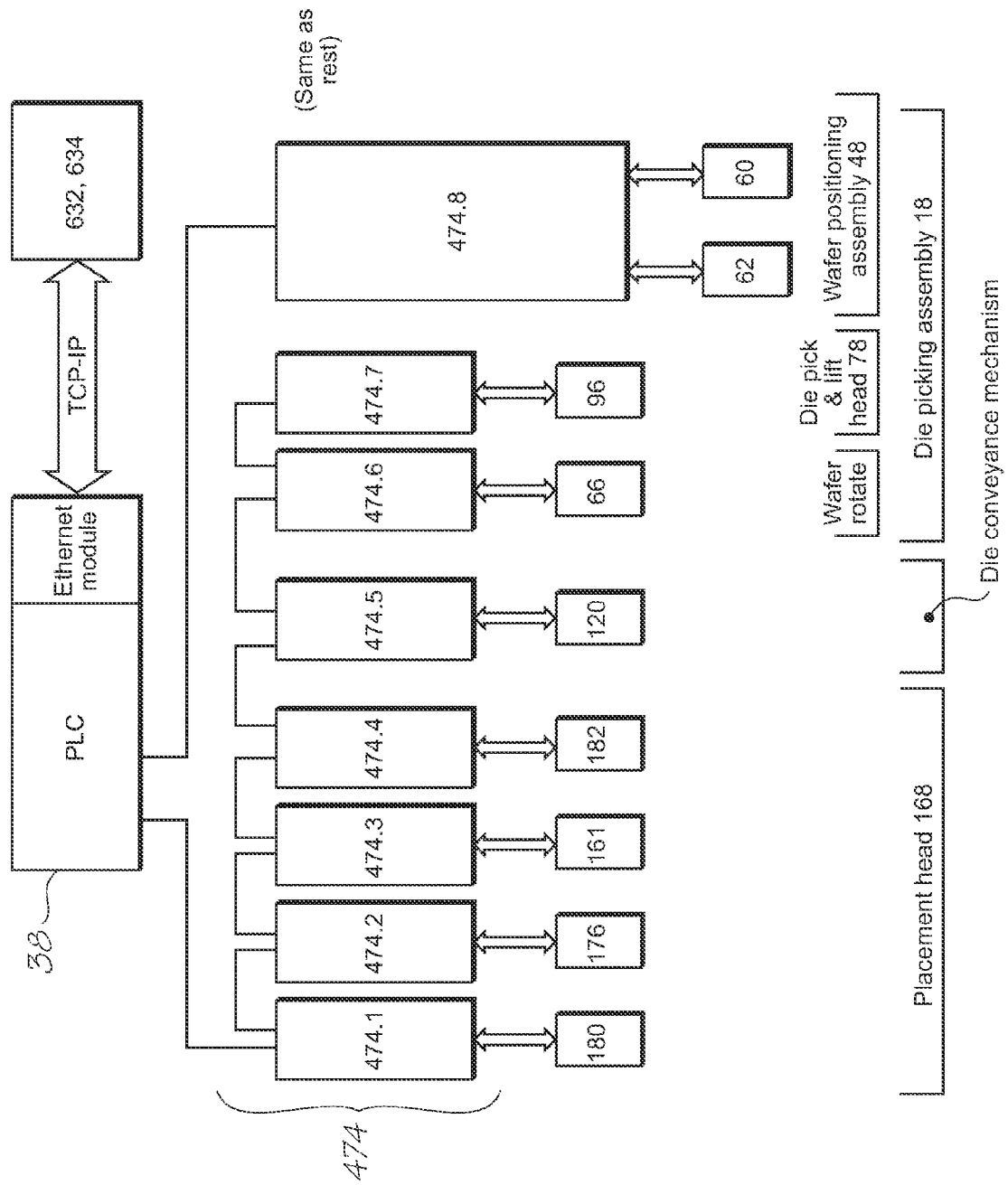
FIG. 31 shows a schematic diagram illustrating interaction of electrical components used for motor control of the assembler of FIG. 3.

FIG. 31 provides a schematic overview of the motor control tasks performed by the PLC 38. As described above, the PLC receives the wafer mapping scheme and related operational parameters from the remote monitoring system having the MES server 632 and the industrial computer 634 (or PC 34), described above. The different motors and drives described above are controlled by the PLC 38 through the respective motor axis controllers collectively indicated by reference numeral 474.

As described above, the placement head 168 includes actuators 161, 176, 180 and 182. The inventor has found that an Akribis linear motor 180 with an Elmo driver 474.1 is suitable for this application. Similarly, a Zaber 2 phase stepper motor 176 with a Copley driver 474.2 is used, along with a Zaber 2 phase stepper motor 182 with a Copley driver 474.4. The angular motor 161 is also a Zaber 2 phase stepper motor with a Copley driver 474.3.

The die conveyance mechanism or shuttle transfer mechanism 20 includes the linear motor 120, which is an Akribis AC servo motor with an Elmo driver 474.5.

Similarly, the die picking assembly 18 includes the actuators 66, 96, 62 and 60, as described above. The wafer positioning assembly 48 has the two stages both actuated by Nanomotion piezo caterpillar motors 60 and 62 having a Nanomotion drivers 474.8. The wafer rotate motor 66 is a Zaber 2 phase stepper motor with a Copley driver 474.6, and the pick head vertical motor 96 is a Zaber 2 phase stepper motor with a Copley driver 474.7. It is to be appreciated that all the drivers 474 provide the PLC 38 with positional feedback information for the drives.

Pneumatic Enclosure 46

Figure 30:
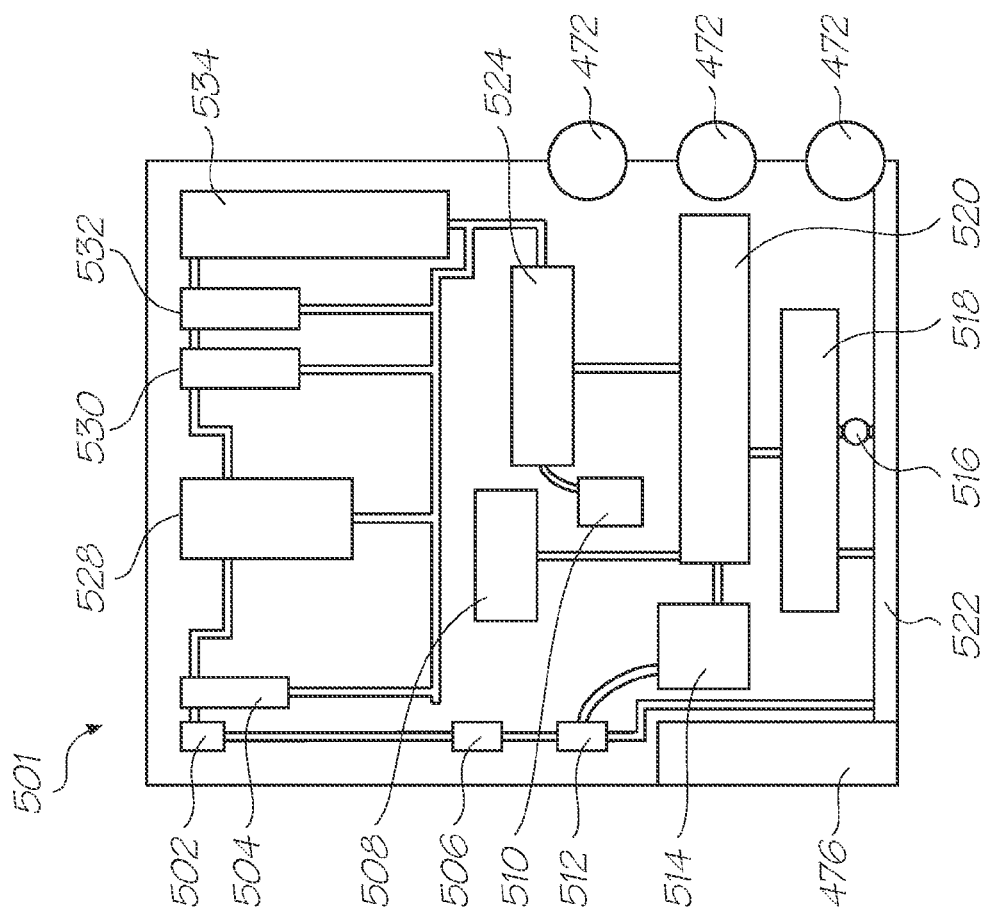
FIG. 30 shows a pneumatic enclosure of the assembler in an open position showing pneumatic components.

FIG. 30 shows the pneumatic enclosure 501 (part of enclosure 46 in FIG. 3) of the assembler 16 in an open position showing the pneumatic components used by this embodiment of the assembler. An SMC AF40 series air filter 504 is used immediately after main shut-off valve 502 to filter impurities from the air supply. The filter 504 has a float type auto-drain system. The assembler 16 also includes an SMC AFM series mist separator 530 to filter particles from the supply, followed by an SMC AFD series micro-mist separator 532 to filter smaller particles which might pass through separator 530. An SMC AME series mist separator 514 is included to absorb fine oil particles from the pneumatic system of the assembler 16.

Inline gas filters 518 are included from the SMC SF series to remove any remaining particles from the pneumatic supply. The filters 518 include a PTFE membrane. High purity valves 520 are included for operating the various pneumatic components, and a membrane air dryer 534 to remove moisture. Pressure regulators 506, 510, 512 and 526 are used to regulate pressure in the various pneumatic systems. Isolation valves 502 and 528 are used to isolate the respective pneumatic circuits from each other. Pressure switches 508 are used to provide pressure readings for the die picker, transfer shuttle and die placement pneumatic systems. Solenoid valves 524 are used to control the pneumatic system with the PLC 38, with flow sensors 516 reporting flow information to the PLC 38.

Safety

The controller or PLC 38 includes a number of safety features for protecting the assembler 16, carrier 10 and wafer 6 from damage, as well as an operator from harm. As such, the PLC 38 is configured to monitor an operational status of the assembler 16 by means of the various components described above. If a potentially hazardous situation is detected, the PLC 38 is configured to deactivate the assembler 16. A hazardous situation can include unexpected electrical fluctuations, pressure fluctuations, unpredictable operational parameters, the PLC 38 sensing the presence of a foreign object proximate moving parts of the assembler 16, or the like.

FIGS. 32 to 37 show circuit diagrams of interconnections between some of the electrical components described above. It is to be appreciated that the circuit diagrams are described in overview with only some of the connections indicated. The circuit diagrams are meant to assist the skilled person in interpreting the interconnections between the components, and not to provide an exhaustive circuit description. In the circuit diagrams, like reference numerals indicate like connections unless otherwise indicated.

Figure 35:
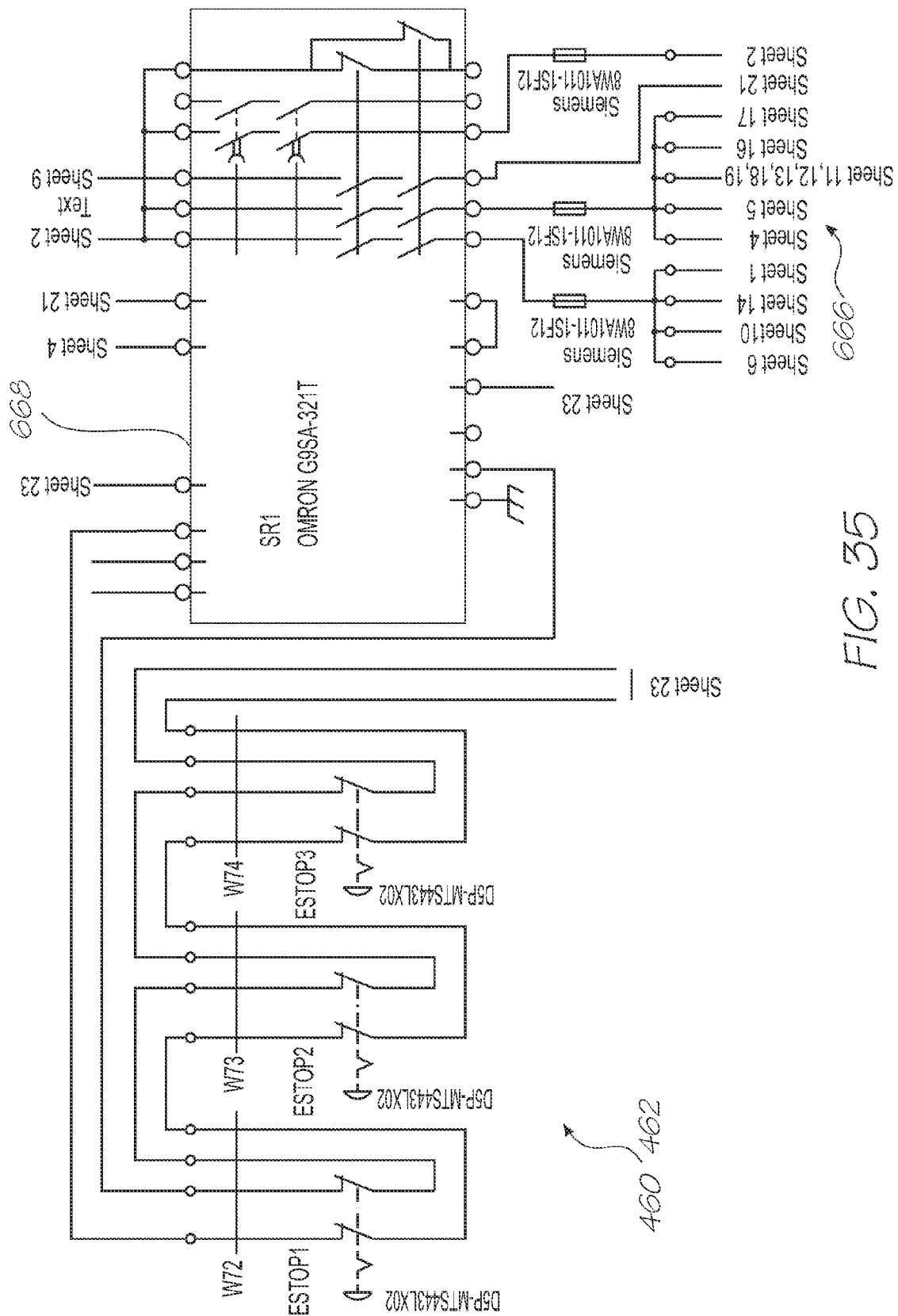
FIG. 35 shows a circuit diagram of a main safety relay of the assembler.

A main safety relay 668 (indicated by reference numeral 492 in FIG. 29) is shown in FIG. 35. The relay 668 is an Omron G9SA-321-T safety relay unit and is connected to emergency stop buttons 460 and 462, as shown. The relay 668 also has connections to the PLC 38 at 666, as shown.

Figure 36:
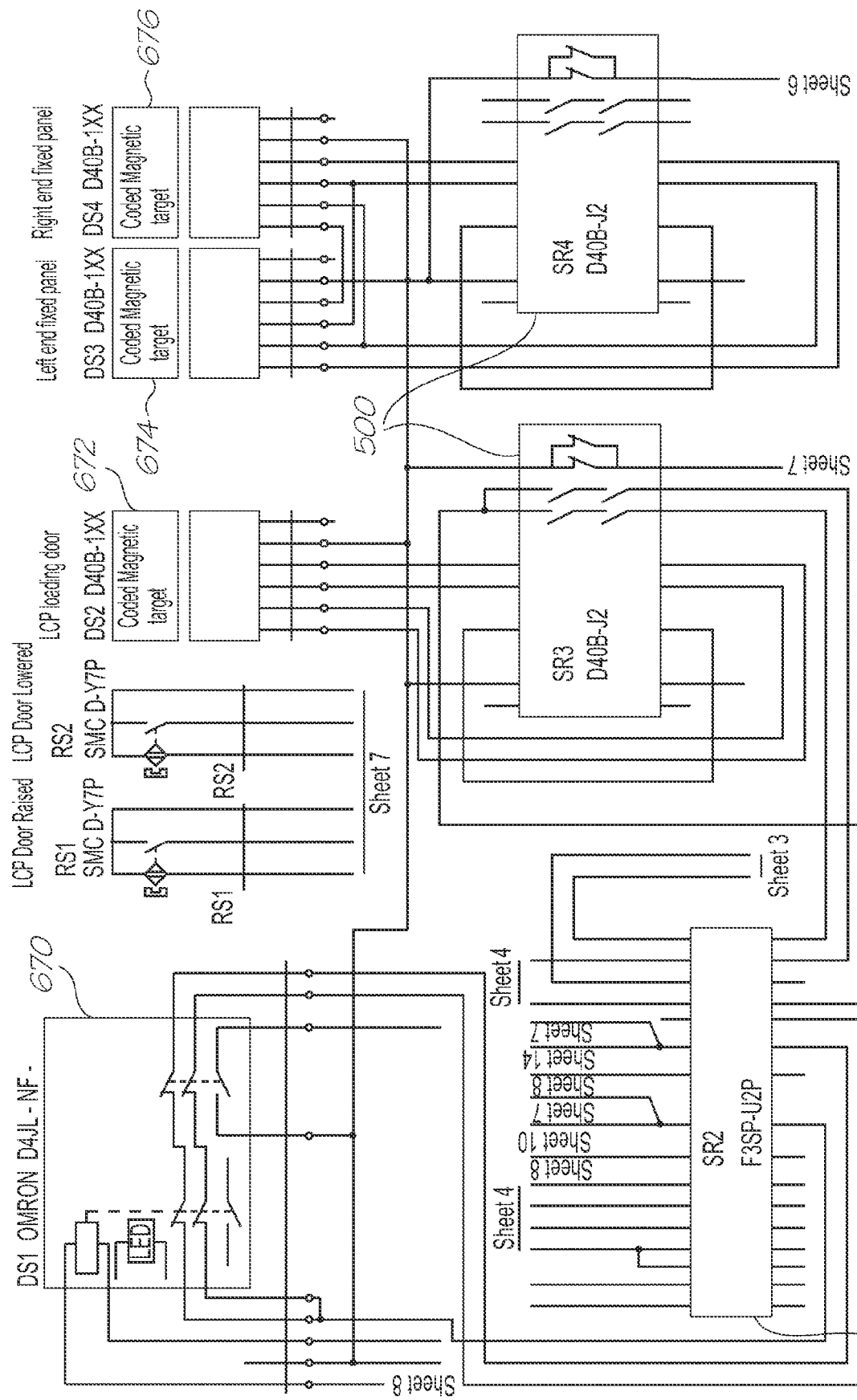
FIG. 36 shows a circuit diagram for an embodiment of a safety system of the assembler.

FIG. 36 shows further component connections of a safety system of the assembler 16. Door muting controller 498 is connected to door switch controllers 500, as shown, and to door safety switch 670. Door switch controllers 500 are arranged in communication with magnetic doors switches 672, 674 and 676, as shown. If any of the assembler's door panels are opened during operation, the safety system automatically deactivates the assembler to prevent injury and/or damage.

Computer Control

FIG. 32 shows a control diagram illustrating one role of the PC 34 in controlling optical components of the assembler 16. As can be seen, the pick cameras 111 and the place cameras 116 are directly connected to the PC 34 with Firewire connections 652. As set out above, the PC 34 is configured to control operation of the cameras 111, 116.

The wafer scribe reader 100 is also connected to the PC 34 with a suitable USB connection, as shown. The PC 34 has an RS232 communications port 654 with which it communicates with a pair of LED lighting controllers 470 (FIG. 33).

Figure 33:
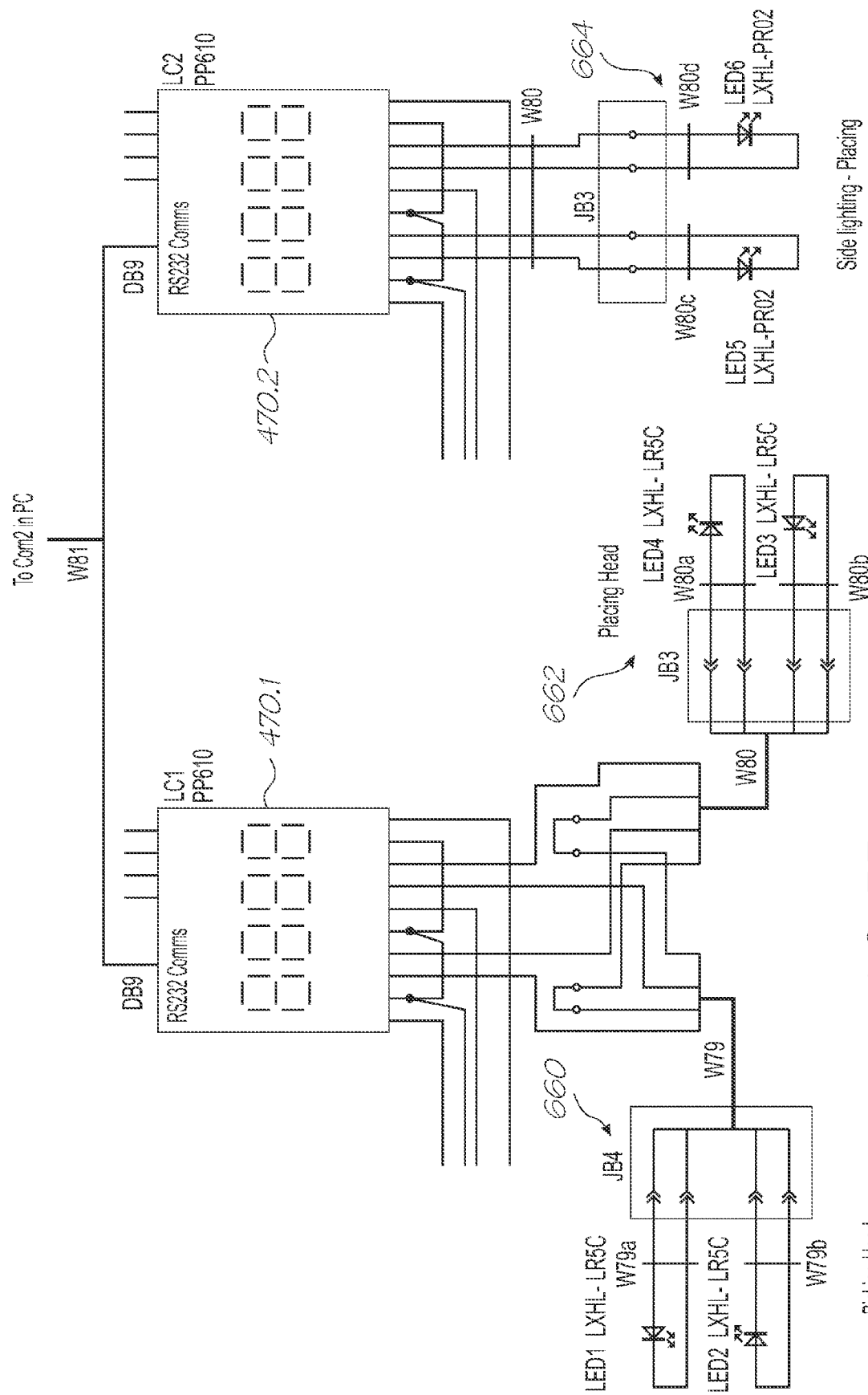
FIG. 33 shows a circuit diagram of an LED controller of the assembler.

FIG. 33 shows the lighting controllers 470 in more detail. The lighting controller 470.1 is configured to control LEDs 660 for the pick head 78 to facilitate detection by the cameras 111. The controller 470.1 is also configured to control LEDs 662 for the place head 170 to facilitate detection by the cameras 166. The lighting controller 470.2 is configured to control LEDs 664 for side lighting for the place head 170.

FIG. 32 also shows the connection between the PC 34 and the Ethernet switch 486. The switch 486 is connected to the PLC 38 at 664 and to an Ethernet network at 666.

Figure 34:
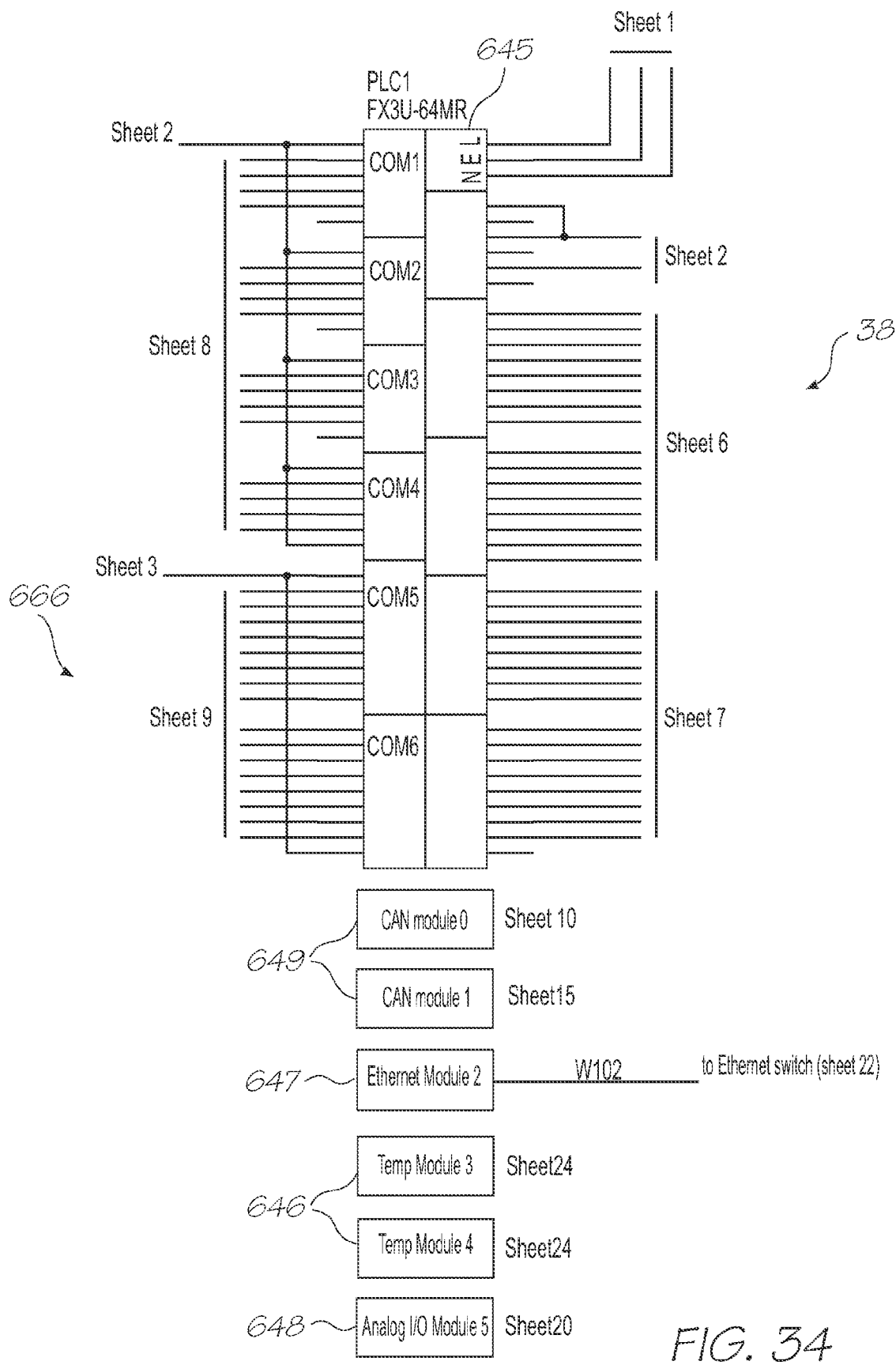
FIG. 34 shows a circuit diagram of a layout of a main controller of the assembler.

FIG. 34 shows the control system of the assembler which includes the PLC 38, which is a Mitsubishi FX3U-64M PLC unit 645 having expansion blocks in the form of a FX2N-2LC temperature control block 646 in the form of modules, a FX3U-ENET Ethernet interface module 647, a FX0N-3A analog I/O special function block or module 648, and a FX2N-32CAN controller area network (CAN) serial bus interface module 649.

Figure 37A:
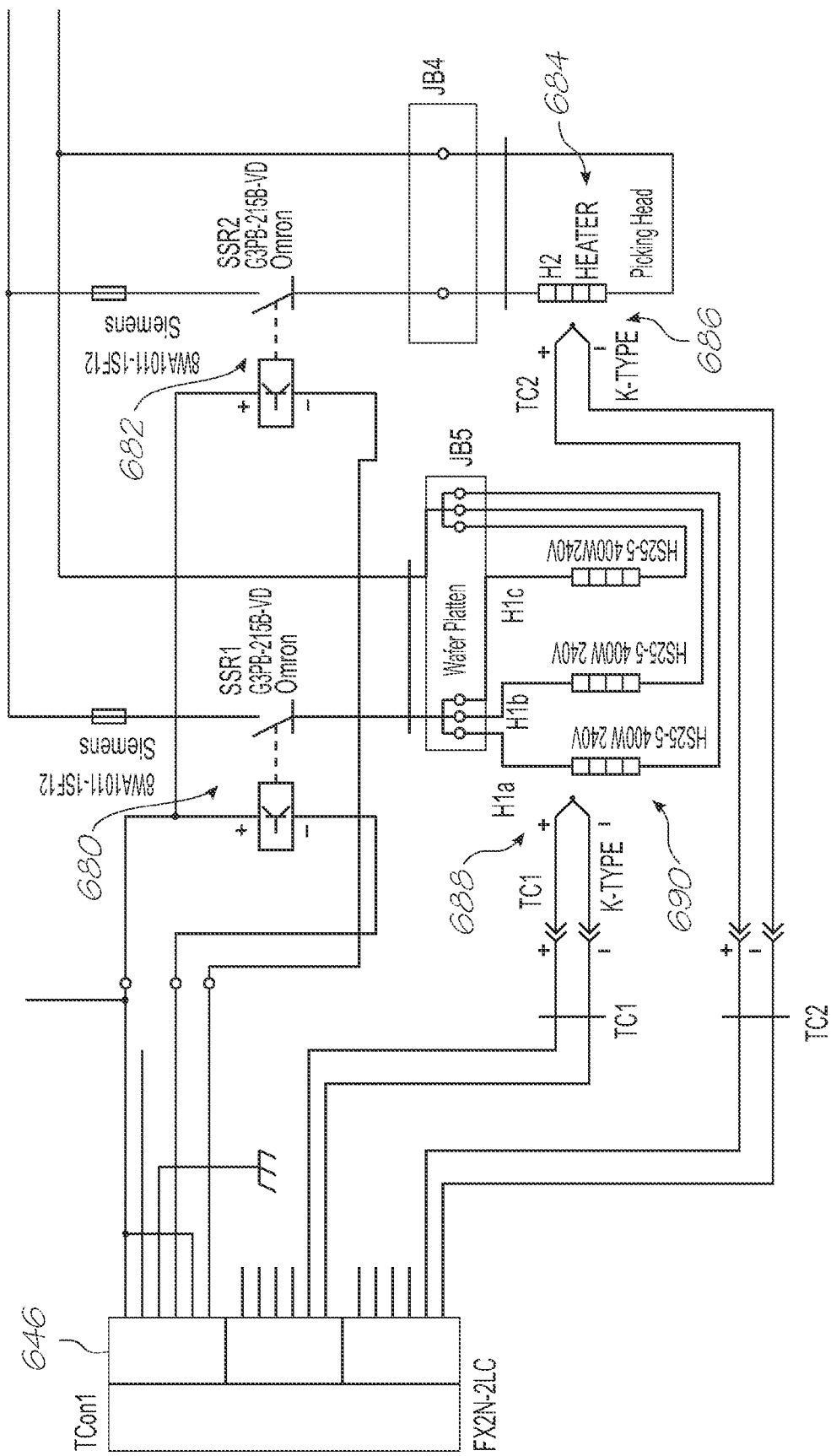
FIGS. 37A and 37B show a circuit diagram of temperature control circuitry of the assembler.
Figure 37B:
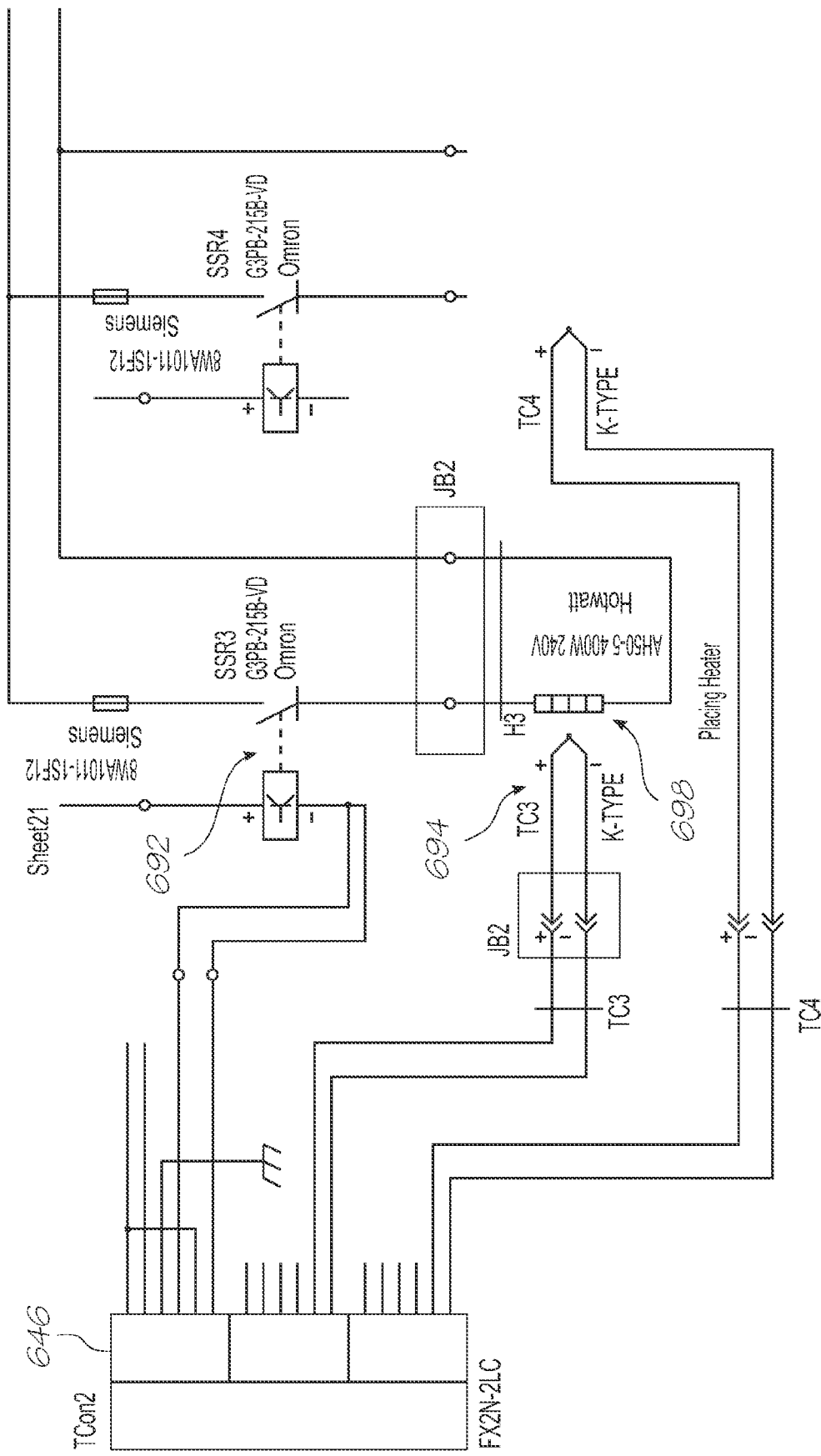

FIG. 37 shows interconnections between the temperature control modules 646 of the PLC 38 and respective heater cartridges and thermocouples used to regulate and control the heating of the wafer 6, the air heater assembly 164, and the heater cartridge 90 of lift head 78.

As shown, one temperature module 646 is responsible for controlling the heater cartridge 684 for the dice pick head 78 via relay 682 and thermocouple 686. Similarly, a temperature cartridge 690 of the wafer support 63 is heated via relay 680 and thermocouple 688 providing temperature feedback. The second temperature module 646 is responsible for control of heater cartridge 698 of the dice placing head via relay 692 and thermocouple 694.

The skilled person will appreciate that the embodiments described above may include various alterations which still fall within the scope of the invention.

The invention claimed is:

1. A dice placement assembly for placing a plurality of inkjet printhead dice on a printhead carrier so as to form a pagewidth inkjet printhead, said assembly comprising:
    a support platform with a clamp mechanism clamping the printhead carrier, said printhead carrier having a plurality of discrete tortuous ink paths for ducting ink to the printhead dice, each of said ink paths terminating at a respective fiducial aperture;
    at least one camera operatively directed at the platform to detect the fiducial apertures on the printhead carrier;
    a supply of the printhead dice, each printhead dice having a fluid inlet for connection to a corresponding fiducial aperture of the printhead carrier;
    a placement device comprising:
        a vacuum mechanism to retrieve a printhead die individually from the supply of printhead dice;
        actuators to align each individually picked printhead die with the printhead carrier and to place the printhead die directly in contact with the printhead carrier once aligned; and
        a heater to heat the printhead die prior to placement on the printhead carrier; and
    a controller operatively controlling the clamp mechanism, the camera and the placement device, configured to facilitate accurate placement of the printhead dice on the printhead carrier such that a predetermined number of printhead die are sequentially positioned across the printhead carrier to form said pagewidth inkjet printhead.

2. The placement assembly of claim 1, wherein the camera includes a camera module linked to a prism by means of an adapter tube to focus said camera on the printhead carrier.

3. The placement assembly of claim 1, wherein the actuators of the placement device includes three stepper motors each separately responsible for vertical, horizontal and angular alignment of the printhead dice with the printhead carrier, respectively.

4. The placement assembly of claim 1, wherein the actuators of the placement device includes a linear translation stage for moving the printhead dice in a vertical direction for placing the printhead dice onto the printhead carrier.

5. The placement assembly of claim 1, wherein the placement device includes a heated air blower configured to direct heated air at the dice prior to the placement device placing the printhead dice onto the printhead carrier.

6. The placement assembly of claim 1, wherein the placement device includes a lighting arrangement for illuminating the printhead carrier to assist the camera in detecting the alignment fiducials.

7. The placement assembly of claim 1, wherein the support platform includes a pneumatically operated self-leveling platform controlled by the controller.

8. A method of placing a plurality of inkjet printhead dice on a printhead carrier so as to form a pagewidth inkjet printhead, said method comprising the steps of:
    clamping the printhead carrier using a clamping mechanism, said printhead carrier having a plurality of discrete tortuous ink paths for ducting ink to the printhead dice, each of said ink paths terminating at a respective fiducial aperture;
    detecting the fiducial apertures on the printhead carrier using at least one camera;
    providing a supply of the printhead dice, each printhead dice having a fluid inlet for connection to a corresponding fiducial aperture of the printhead carrier;
    placing the printhead dice on the printhead carrier, said placing comprising the steps of:
        picking an individual printhead die from the supply of printhead dice using a vacuum mechanism;
        aligning each individually picked printhead die with the printhead carrier and placing the printhead die directly in contact with the printhead carrier once aligned; and
        heating the printhead die prior to placement on the printhead carrier; and
    repeating said steps until a predetermined number of printhead dice are sequentially positioned across the printhead carrier to form said pagewidth inkjet printhead.

* * * * *